US012198760B2

(12) United States Patent
Nazarian

(10) Patent No.: US 12,198,760 B2
(45) Date of Patent: Jan. 14, 2025

(54) DIFFERENTIAL PROGRAMMING OF TWO-TERMINAL MEMORY WITH INTRINSIC ERROR SUPPRESSION AND WORDLINE COUPLING

(71) Applicant: Crossbar, Inc., Santa Clara, CA (US)

(72) Inventor: Hagop Nazarian, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 90 days.

(21) Appl. No.: 17/895,129

(22) Filed: Aug. 25, 2022

(65) Prior Publication Data

US 2024/0071490 A1 Feb. 29, 2024

(51) Int. Cl.
G11C 13/00 (2006.01)

(52) U.S. Cl.
CPC ...... *G11C 13/0059* (2013.01); *G11C 13/0002* (2013.01); *G11C 13/003* (2013.01); *G11C 13/004* (2013.01); *G11C 13/0069* (2013.01); *G11C 2213/78* (2013.01); *G11C 2213/79* (2013.01)

(58) Field of Classification Search
CPC .............. G11C 13/0059; G11C 13/004; G11C 13/0069; G11C 7/24; G11C 2013/0076; G11C 13/0002; G11C 17/165; G11C 13/0007; G11C 2213/74; G11C 2213/78; G11C 2213/79; G11C 13/003; G11C 17/18
See application file for complete search history.

(56) References Cited

U.S. PATENT DOCUMENTS

| 7,006,373 | B2 | 2/2006 | Hidaka |
| 7,672,155 | B2 | 3/2010 | Kim et al. |
| 9,520,173 | B1 | 12/2016 | Baker, Jr. et al. |
| 10,692,575 | B1 | 6/2020 | Huang |
| 12,080,347 | B1 | 9/2024 | Nazarian |
| 2007/0058425 | A1 | 3/2007 | Cho et al. |
| 2007/0247940 | A1 | 10/2007 | Liaw et al. |
| 2008/0137436 | A1 | 6/2008 | Salter |
| 2011/0299340 | A1 | 12/2011 | Samachisa et al. |

(Continued)

FOREIGN PATENT DOCUMENTS

CN 114187945 A 3/2022

OTHER PUBLICATIONS

Notice of Allowance for U.S. Appl. No. 17/710,835 dated Oct. 18, 2023, 8 pages long.

(Continued)

*Primary Examiner* — Huan Hoang
*Assistant Examiner* — Justin Bryce Heisterkamp
(74) *Attorney, Agent, or Firm* — Wegman Hessler Valore

(57) ABSTRACT

Improved differential programming of multiple two-terminal memory cells that define an identifier bit is provided. A differential circuit can be defined by a plurality of resistive memory cells connected to a single bitline of an array, with respective wordlines coupling second terminals of the memory cells to ground (or low voltage). Some disclosed circuits can provide very rapid intrinsic suppression of a non-programmed memory cell(s) defining an identifier bit in response to programming of another memory cell (or group of cells) defining the identifier bit. Differential programming can reduce power consumption and mitigate or avoid invalid data results for an identifier bit.

20 Claims, 13 Drawing Sheets

(56) References Cited

U.S. PATENT DOCUMENTS

| | | |
|---|---|---|
| 2012/0320658 A1 | 12/2012 | Wang et al. |
| 2014/0269008 A1 | 9/2014 | Barker, Jr. |
| 2014/0321193 A1* | 10/2014 | Park .................. G11C 13/0069 257/295 |
| 2015/0269993 A1 | 9/2015 | Shieh et al. |
| 2016/0133325 A1 | 5/2016 | Lan et al. |
| 2016/0284403 A1 | 9/2016 | Navon et al. |
| 2019/0080754 A1* | 3/2019 | Tran .................. G11C 13/0026 |
| 2019/0287612 A1 | 9/2019 | Zheng-Jun et al. |
| 2019/0341107 A1 | 11/2019 | Bertin |
| 2021/0201997 A1* | 7/2021 | Yuh .......................... G11C 8/16 |
| 2022/0036949 A1 | 2/2022 | Asnaashari et al. |
| 2022/0084592 A1 | 3/2022 | Tamara |
| 2022/0122660 A1* | 4/2022 | Nissan-Cohen ... G11C 13/0007 |
| 2022/0375536 A1* | 11/2022 | Strachan ............ G11C 13/0007 |
| 2023/0059091 A1* | 2/2023 | Ezzadeen ........... G11C 13/0038 |
| 2023/0138195 A1 | 5/2023 | Park et al. |

OTHER PUBLICATIONS

Ex Parte Quayle action for U.S. Appl. No. 17/710,858, dated Jan. 31, 2024, Oct. 3, 2023, 8 pages long.

Notice of Allowance for U.S. Appl. No. 17/710,858, dated Jan. 31, 2024, 8 pages long.

International Search Report and Written Opinion for International Application No. PCT/US2023/065178 dated Jul. 24, 2023, 7 pages.

Notice of Allowance for U.S. Appl. No. 17/710,835, dated Apr. 9, 2024, 10 pages long.

Office Action for U.S. Appl. No. 17/710,809, dated May 24, 2024, 19 pages long.

Notice of Allowance for U.S. Appl. No. 17/895,129, dated Sep. 5, 2024, 19 pages long.

Notice of Allowance for U.S. Appl. No. 17/710,858, dated Aug. 1, 2024, 15 pages long.

Non-Final Office action for U.S. Appl. No. 18/587,443, dated Sep. 19, 2024, 15 pages long.

Notice of Allowance for U.S. Appl. No. 18/587,443, dated Dec. 2, 2024, 13 pages long

* cited by examiner

DIFFERENTIAL PROGRAMMING OF TWO-TERMINAL MEMORY WITH INTRINSIC ERROR SUPPRESSION AND WORDLINE COUPLING

INCORPORATION BY REFERENCE

U.S. patent application Ser. No. 17/708,491 filed Mar. 30, 2022 and titled "DYNAMIC HOST ALLOCATION OF PHYSICAL UNCLONABLE FEATURE OPERATION FOR RESISTIVE SWITCHING MEMORY", U.S. patent application Ser. No. 17/710,809 filed Mar. 31, 2022 and titled "DIFFERENTIAL PROGRAMMING OF TWO-TERMINAL RESISTIVE SWITCHING MEMORY WITH INTRINSIC ERROR SUPPRESSION", and U.S. patent application Ser. No. 17/223,817 filed Apr. 6, 2021 and titled DISTINCT CHIP IDENTIFIER SEQUENCE UTILIZING UNCLONABLE CHARACTERISTICS OF RESISTIVE MEMORY ON A CHIP, are hereby incorporated by reference herein in their respective entireties and for all purposes.

TECHNICAL FIELD

The subject disclosure relates generally to two-terminal memory devices, and as one illustrative example, differential programming of multiple two-terminal memory cells that detects a program event in one cell and disconnects the multiple cells from a voltage source.

BACKGROUND

Resistive-switching memory represents a recent innovation within the field of integrated circuit technology. While much of resistive-switching memory technology is in the development stage, various technological concepts for resistive-switching memory have been demonstrated and are in one or more stages of verification to prove or disprove associated theories or techniques. Resistive-switching memory technology is expected to show compelling evidence of substantial advantages over competing technologies in the semiconductor electronics industry in the near future.

Proposals for practical utilization of resistive-switching technology to memory applications for electronic devices have been put forth. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors, for instance.

In additional to memory elements, volatile resistive-switching elements have been proposed in conjunction with a MOS transistor for a high speed non-volatile memory device, or as a high-speed field actuated switch, or selector device. Still further, stochastic characteristics of resistive-switching structures have been proposed by the inventor as suitable for generating non-correlated data for random number generation, or similar applications. Each of these applications has met different needs for electronic memory applications or specialty data generation applications.

In light of the above, the Assignee of the present disclosure continues to develop and pursue practical utilizations of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Embodiments of the present disclosure provide an architecture for differential programming of multiple two-terminal resistive switching memory cells that define a single bit. In an embodiment(s), the single bit can be an identifier bit such as a physical unclonable feature (PUF) bit or a random number generation (RNG) bit, or the like. The disclosed differential programming can apply a program cycle on a bitline coupled to multiple memory cells, and electrically short second terminals of the multiple memory cells by a wordline-activated switch. Programming of one of the multiple memory cells to a low resistance state can intrinsically suppress programming of remaining memory cells. The intrinsic suppression can be very rapid, and greatly mitigate or avoid an invalid data result for the identifier bit. In addition, the program cycle can be disconnected from the bitline in response to measuring a program event on the bitline and prior to a duration of the program cycle. Disconnection of the program cycle can serve to further mitigate an invalid data result for the identifier bit, as well as reduce power consumption associated with the differential programming. In various embodiments, disconnecting the program cycle can be implemented in conjunction with the intrinsic suppression of the non-programmed cell(s).

In an embodiment, disclosed is an integrated circuit device. The integrated circuit device can comprise an array of two-terminal resistive switching memory (ReMEM) cells comprising a bitline, and a first one-transistor, one-resistor (1T1R) ReMEM circuit comprising a transistor and a two-terminal ReMEM cell, wherein the two-terminal ReMEM cell has a first terminal coupled to the bitline and a second terminal coupled to a channel node of the transistor, and wherein a second channel node of the transistor is coupled to ground. In addition to the foregoing, the array can comprise a second 1T1R ReMEM circuit comprising a second transistor and a second two-terminal ReMEM cell, wherein the second two-terminal ReMEM cell can have a first terminal coupled to the bitline and a second terminal coupled to a channel node of the second transistor, and wherein a second channel node of the second transistor is coupled to ground. Additionally, the array can comprise a switching circuit electrically coupled to the second terminal of the second ReMEM cell and to the second terminal of the first ReMEM cell, and a pass wordline for selectively activating or deactivating the switching circuit to electrically short or electrically isolate, respectively, the second terminal of the ReMEM cell and the second terminal of the second ReMEM cell. Still further, the array can comprise a first wordline coupled to a gate node of the transistor for connecting or disconnecting the second terminal of the two-terminal ReMEM cell to ground and can comprise a second wordline coupled to a gate node of the second transistor for connecting or disconnecting the second terminal of the second two-terminal ReMEM cell to ground.

Further aspects of the disclosed embodiments provide a method for differential programming of an identifier circuit comprising a plurality of ReMEM cells. The method can comprise initiating a differential program for a physical unclonable feature (PUF) circuit comprising a plurality of ReMEM cells, wherein the plurality of ReMEM cells are part of an array of ReMEM cells, and precharging a bitline of the array of ReMEM cells to a program voltage, wherein the bitline is connected to a first terminal of a first ReMEM cell of the plurality of ReMEM cells and is connected to a first terminal of a second ReMEM cell of the plurality of ReMEM cells. Further, the method can comprise activating a pass transistor and electrically short second terminals of the first ReMEM cell and of the second ReMEM cell. In addition to the foregoing, the method can comprise activating one or more wordlines of the array of ReMEM cells and couple the shorted second electrodes to low voltage and terminating the differential program in response to the first ReMEM cell or the second ReMEM cell becoming programmed.

Further embodiments can provide a method of fabricating a memory device. The method can comprise forming an array of resistive memory cells, defining a sub-array of the array for physical unclonable feature (PUF) memory cells and coupling a bitline of the array to first terminals of a plurality of resistive memory cells in the PUF sub-array. Further, the method can comprise forming respective transistors for each of the plurality of resistive memory cells and connecting the transistors in electrical series with respective memory cells of the plurality of resistive memory cells and ground. Still further, the method can comprise forming a set of wordlines and connect respective ones of the wordlines to gate nodes of the respective transistors and forming a pass transistor having a first channel node connected to a second terminal of a first of the plurality of resistive memory cells and having a second channel node connected to a second terminal of a second of the plurality of resistive memory cells. In addition to the foregoing the method can comprise forming a pass wordline coupled to a gate node of the pass transistor to electrically connect or disconnect the second terminals of the first of the plurality of resistive memory cells and the second of the plurality of resistive memory cells. Moreover, the method can comprise forming a voltage source, forming a shut-off transistor and coupling the voltage source to the bitline of the array through the shut-off transistor.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Introduction

Figure 1:
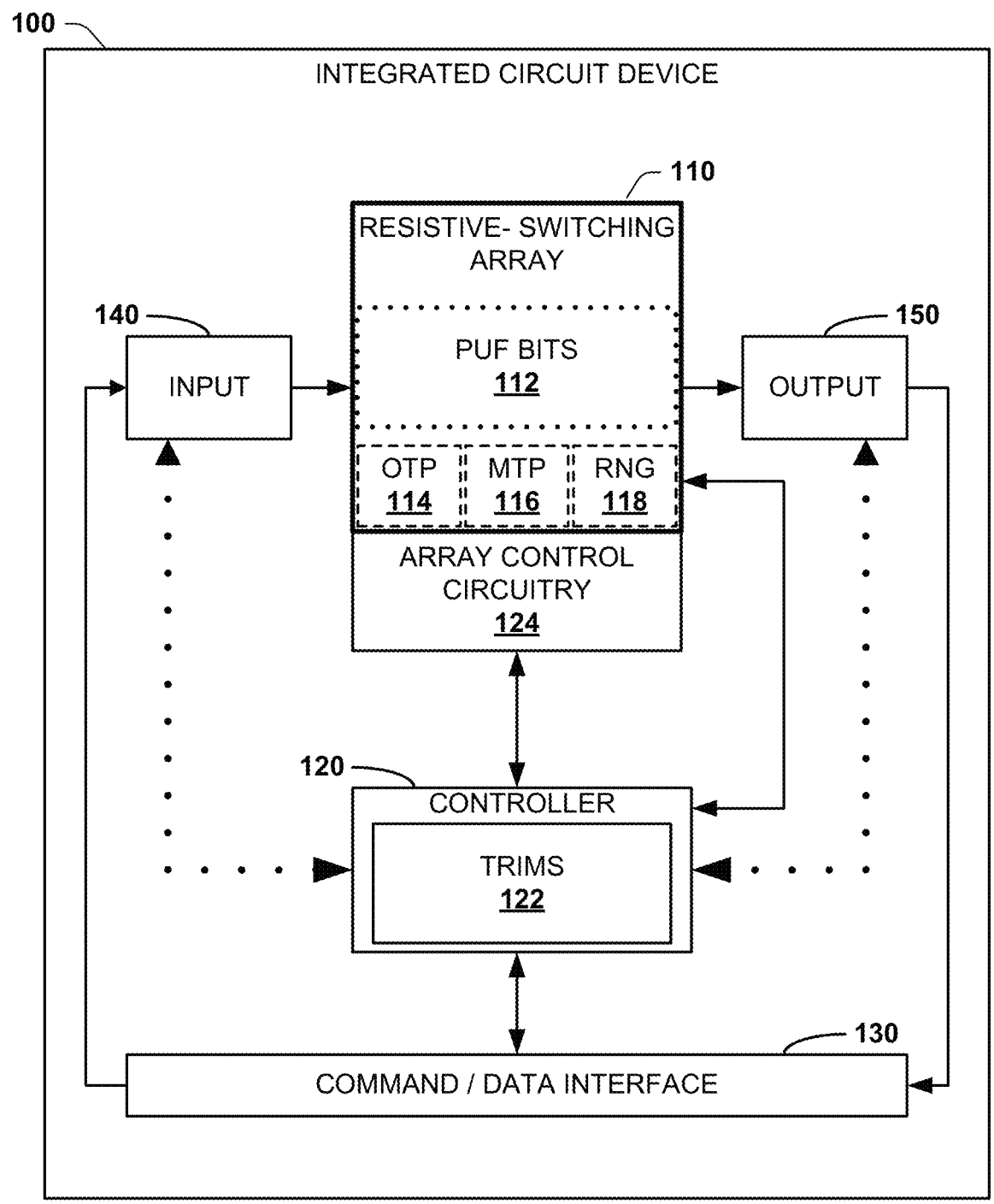
FIG. 1 depicts a block diagram of an example integrated circuit device and array of two-terminal resistive memory (ReMEM) for differential programming, in an embodiment(s).

One or more embodiments of the present disclosure leverage stochastic or substantially stochastic physical characteristics of nano-scale resistive switching devices to generate data. Being generally random, stochastic features of resistive switching devices can be leveraged to produce data that has little to no correlation among a population of such devices. As a result, that data can be suited to applications requiring distinct or unique identification, such as identification and authorization applications pertaining to a device (e.g., a semiconductor die or chip, a semiconductor wafer, group(s) of dies, group(s) of wafers, an electronic device incorporating a semiconductor die(s), and so forth). Further, highly non-correlated data can also be utilized for security applications, such as random number generation, cryptography key generation applications, and the like.

More generally, stochastic physical characteristics can also be referred to as physical unclonable functions (PUF), physically unclonable features (also PUF), physical(ly) unclonable features, or other suitable nomenclature. Data derived from such stochastic physical characteristics are referred to herein as PUF data (or a PUF bit, or group of PUF bits, etc.) and generally involve a resistive switching cell process applied to one or more resistive switching cells that define a PUF bit(s) (e.g., see U.S. patent application Ser. No. 17/223,817 filed Apr. 6, 2021, incorporated by reference hereinabove). PUF data can be generated from a cell process(es) applied to native resistive switching memory cells (sometimes referred to as virgin resistive switching memory cells) that have not had a memory process previously applied to those memory cells, following manufacture.

Example memory processes can include a forming process (e.g., comprising one or more electrical forming pulses), a program process (e.g., comprising one or more electrical program pulses), an erase process (e.g., comprising one or more electrical erase pulses), an overwrite process, and so forth. In addition, PUF data generated from non-volatile resistive switching memory cells can thereafter be stored and read from at least a subset of the non-volatile resistive switching memory cells utilized to generate the PUF data.

In addition, various embodiments disclose resistive switching device processes utilized to generate high-entropic data sequences that meet or exceed scientific standards for randomness, and are comparable with high-quality cryptographic random number sources. In some embodiments, the switching device processes utilized to generate data sequences can be selected from native resistive switching devices (e.g., devices that have not previously been programmed, and are original or virgin devices post-fabrication) that most closely leverage nano-scale unclonable physical characteristics of the resistive switching devices. In other embodiments, switching device processes can be selected from resistive switching devices having low cycle count (e.g., less than a dozen program-erase cycles, less than a few hundred program-erase cycles, less than a few thousand program-erase cycles, and so forth), particularly for random number generation (RNG) with good randomness but not requiring highest-quality entropy utilized for cryptography. In general, leveraging physical characteristics of resistive switching devices achieves high non-correlation among devices on a die (intra-die), among dies on a wafer (inter-die) and among wafers in a fabrication facility, minimizing likelihood that a data sequence generated from resistive switching devices on a single die is repeated among dies, devices, wafers, etc.

As utilized herein, non-correlated data produced from physical features of resistive memory, whether PUF data or RNG data, are referred to more generally as identifier data. Some disclosed embodiments propose aggregation of multiple memory cells to define a single bit: also called a differential bit, or the like. Where multiple memory cells leverage physical unclonable features to produce non-correlated data the data can be referred to as a differential identifier bit, or just an identifier bit. Thus, the identifier bit can be a single memory cell producing non-correlated data or multiple memory cells utilized to generate non-correlated data, depending on context.

Program processes to generate data for an identifier bit defined by multiple cells are disclosed herein, and referred to generally as differential program processes. In some embodiments, a differential program process applying a program cycle concurrently to all memory cells defining an identifier bit is provided. In various disclosed aspects of such embodiments, differential programming can include detection of a program event(s) for one (or a group) of the memory cells and disconnection of the multiple cells from supply voltage. Other aspects include intrinsic suppression of non-programmed memory cells in response to a program event for one (or a group) of the memory cells. These aspects can mitigate or avoid invalid data results for differential programming, as well as reduce power consumption as described in more detail herein.

Resistive switching memory cells suitable for generating identifier data include two-terminal resistive switching memory cells. Such memory cells can be utilized to generate PUF data and random number generation (RNG) data, but also one-time programmable (OTP) data and many-time programmable (or re-programmable, overwritable, etc.) (MTP) data, Such two-terminal resistive switching memory cells can include: filamentary resistive switching memory (ReMEM), resistive random access memory (RRAM®), phase change memory (PCRAM), conductive-bridging memory (CBRAM®), programmable metallization cell memory (PMC), as well as magnetic memories such as magneto resistive memory (MRAM), spin torque transfer magneto resistive memory (STT-MRAM), vertical transport magneto resistive memory (VMRAM), ferroelectric memory (FeRAM), or other suitable two-terminal charge storage memory(ies). Where suitable to one of ordinary skill in the art, the foregoing memory technologies, similar memory technologies, or suitable subsets thereof are considered within the meaning of two-terminal resistive switching memory for one or more embodiments of the present disclosure.

In one or more additional embodiments, some disclosed sequence generation processes can be rendered permanent through one-time programmable processes, allowing a sequence to be reliably re-read over a very large number of read cycles to reliably and accurately reproduce a previously generated data sequence, achieving extremely low bit error rates. In still further embodiments, disclosed processes for generating non-correlated data sequences can involve processes compatible with resistive switching device operation, allowing a set of resistive switching devices to be selected post-fabrication from any suitable subset of resistive switching devices on a chip. Systems and methods are further provided to export control of resistive switching device selection, data sequence process selection and process configuration-associated with physically unclonable data sequence generation disclosed herein—to a user of the chip post-fabrication. Various other embodiments will be readily apparent based on the disclosure herein and the associated drawings.

As utilized herein, the term "substantially" and other relative terms or terms of degree (e.g., about, approximately, substantially, and so forth) are intended to have the meaning specified explicitly in conjunction with their use herein, or a meaning which can be reasonably inferred by one of ordinary skill in the art, or a reasonable variation of a specified quality(ies) or quantity(ies) that would be understood by one of ordinary skill in the art by reference to this entire specification (including the knowledge of one of ordinary skill in the art as well as material incorporated by reference herein). As an example, a term of degree could refer to reasonable manufacturing tolerances about which a specified quality or quantity could be realized with fabrication equipment. Thus, as a specific illustration, though non-limiting, for an element of a resistive switching device expressly identified as having a dimension of about 50 angstroms (A), the relative term "about" can mean reasonable variances about 50 A that one of ordinary skill in the art would anticipate the specified dimension of the element could be realized with commercial fabrication equipment, industrial fabrication equipment, laboratory fabrication equipment, or the like, and is not limited to a mathematically precise quantity (or quality). In other examples, a term of degree could mean a variance of +/−0-3%, +/−0-5%, or +/−0-10% of an expressly stated value, where suitable to one of ordinary skill in the art to achieve a stated function or feature of an element disclosed herein. In still other examples, a term of degree could mean any suitable variance in quality(ies) or quantity(ies) that would be suitable to accomplish an explicitly disclosed function(s) or feature(s) of a disclosed element. Accordingly, the subject specification is by no means limited only to specific qualities and quantities disclosed herein, but includes all variations of a specified quality(ies) or quantity(ies) reasonably conveyed to one of ordinary skill in the art by way of the context disclosed herein.

Integrated circuit techniques for fabricating resistive switching memory can cause physical properties having the stochastic or substantially stochastic characteristics desired for generating PUF data. For instance, these physical properties can have little or no replication or repetition among fabricated memory cells made by the same process. As one example, one or more layers of a disclosed resistive switching device can have a root mean square (RMS) surface roughness of >0.2 nm, up to a maximum of about 10.0 nm surface roughness, in an embodiment. This results in random or near-random variation in layer thickness, including unpredictable changes in physical characteristics of such devices. In some theoretical models the RMS surface roughness can affect the geometry of a resistive switching material layer inducing stochastic or substantially stochastic variations in resistive switching device properties such as: native or virgin (e.g., as fabricated) current conductance, program voltage, differential program voltage, program speed, differential program speed, among others disclosed throughout this specification. As further examples, different resistive-switching memory cells and cell technologies can have different discrete programmable resistances, different associated program/erase voltages, as well as other differentiating characteristics. In an embodiment, a resistive switching memory device resulting from a 28 nm photolithographic process with device size between about 50 nanometer (nm) width and about 130 nm width (e.g., about 100 nm width, about 56 nm width, about 75 nm width, about 128 nm width, and so forth) can be suitable to achieve stochastic physical characteristics disclosed herein. In other embodiments, a 22 nm photolithographic process producing a device size between 40 nm and 100 nm width (e.g., about 44 nm width, about 60 nm width, about 66 nm width, about 88 nm width, and so forth) can achieve stochastic physical characteristics.

In addition to the foregoing, stochastic physical features of resistive switching devices can vary among devices in a die and among devices on a wafer or multiple wafers. As a result, a current flow through the RSL in a native un-programmed state, a program voltage in the native un-programmed state, a program speed in the native un-programmed state, differential program voltage/current/speed in the native un-programmed state, and so on, can vary among resistive switching devices. Processes disclosed herein for forming resistive switching devices and for leveraging stochastic or substantially stochastic physically unclonable features of resistive switching devices can provide excellent non-correlated data sequences.

As utilized herein, the term "native", "original", "virgin" or the like refers to post-fabrication but pre-commercial operation of resistive switching devices on a semiconductor die. Native (and like terminology) need not exclude some or all post-fabrication operations such as quality testing or other verification routines performed by a manufacturer, and even some pre-commercial operation by a non-manufacturer such as testing to ensure manufacturer quality specifications are met by a chip, chip setup routines or configuration routines (e.g., defining one-time programmable memory or identifier memory within an array of resistive switching memory; see e.g., FIG. 1, infra), among others. In general, a resistive switching device is in a native state, as utilized herein, if it has not yet received a stimulus (e.g., electrical, thermal, magnetic, or a like stimulus known in the art, suitable combinations thereof, and so forth) suitable to form a conductive filament within the resistive switching device and change the resistive switching device from an electrically resistive state to an electrically conductive state as described herein or known in the art.

As the name implies, a two-terminal resistive switching device has two terminals or electrodes. Herein, the terms "electrode" and "terminal" are used interchangeably; moreover, a two-terminal resistive switching device includes a non-volatile two-terminal memory device as well as a volatile two-terminal switching device. Generally, a first electrode of a two-terminal resistive switching device is referred to as a "top electrode" (TE) and a second electrode of the two-terminal resistive switching device is referred to as a "bottom electrode" (BE), although it is understood that electrodes of two-terminal resistive switching devices can be according to any suitable arrangement, including a horizontal arrangement in which components of a memory cell are (substantially) side-by-side rather than overlying one another. Between the TE and BE of a two-terminal resistive switching device is typically an interface layer sometimes referred to as a switching layer, a resistive switching medium (RSM) or a resistive switching layer (RSL); such devices are not limited to these layers, however, as one or more barrier layer(s), adhesion layer(s), ion conduction layer(s), seed layer(s), particle source layer(s) or the like—as disclosed herein, disclosed within a publication incorporated by reference herein, as generally understood and utilized in the art or reasonably conveyed to one of ordinary skill in the art by way of the context provided herein and its addition to the general understanding in the art or the incorporated publications—may be included between or adjacent one or more of the TE, the BE or the interface layer consistent with suitable operation of such device.

Composition of memory cells, generally speaking, can vary per device with different components, materials or deposition processes selected to achieve desired characteristics (e.g., stoichiometry/non-stoichiometry, volatility/non-volatility, on/off current ratio, switching time, read time, memory durability, program/erase cycle, and so on). One example of a filamentary-based device can comprise: a conductive layer, e.g., metal, metal-alloy, metal-nitride, (e.g., comprising TiN, TaN, TiW, or other suitable metal compounds), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.)), a resistive switching layer (RSL) and an active metal-containing layer capable of being ionized. Under suitable conditions, the active metal-containing layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer. A memory cell having such characteristics may be described as a filamentary-based device.

In some embodiments, a RSL employed as part of a non-volatile memory device (non-volatile RSL) can include a relatively large number (e.g., compared to a volatile selector device) of material voids or defects to trap neutral metal particles (e.g., at low voltage) within the RSL. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as stoichiometric or non-stoichiometric: compounds, nitrides, oxides, alloys, mixtures or combinations of the foregoing or similar materials can be employed for the active metal-containing layer in some aspects of the subject disclosure. Further, a non-stoichiometric compound, such as a non-stoichiometric metal oxide/metal-oxygen or metal nitride/metal nitrogen (e.g., $AlO_x$, $AlN_x$, $CuO_x$, $CuN_x$, $AgO_x$, $AgN_x$, and so forth, where x is a suitable positive number or range of numbers, such as: $0<x<2$, $0<x<3$, $0<x<4$ or other number/range of numbers depending on metal compound, which can have differing values for differing ones of the non-stoichiometric compounds) or other suitable metal compound can be employed for the active metal-containing layer, in at least one embodiment.

In one or more embodiments, a disclosed filamentary resistive switching device can include an active metal layer comprising a metal-nitrogen selected from the group consisting of: $TiN_x$, $TaN_x$, $AlN_x$, $CuN_x$, $WN_x$ and $AgN_x$, where x is a positive number (or range of numbers) that can vary per metal-nitrogen material. In a further embodiment(s), the active metal layer can comprise a metal-oxygen selected from the group consisting of: $TiO_x$, $TaO_x$, $AlO_x$, $CuO_x$, $WO_x$ and $AgO_x$ where x is a positive number (or range of numbers) that can likewise vary per metal-oxygen material. In yet another embodiment(s), the active metal layer can comprise a metal oxygen-nitrogen selected from the group consisting of: $TiO_aN_b$, $AlO_aN_b$, $CuO_aN_b$, $WO_aN_b$ and $AgO_aN_b$, where a and b are suitable positive numbers/ranges of numbers. The disclosed filamentary resistive switching device can further comprise a switching layer comprising a switching material selected from the group consisting of: $SiO_y$, $AlN_y$, $TiO_y$, $TaO_y$, $AlO_y$, $CuO_y$, $TiN_x$, $TiN_y$, $TaN_x$, $TaN_y$, $SiO_x$, $SiN_y$, $AlN_x$, $CuN_x$, $CuN_y$, $AgN_x$, $AgN_y$, $TiO_x$, $TaO_x$, $AlO_x$, $CuO_x$, $AgO_x$, and $AgO_y$, where x and y are positive numbers (or ranges), and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a stoichiometric or non-stoichiometric metal compound (or mixture) and a resistive switching layer. In one alternative embodiment of this example, the particle donor layer comprises a metal-nitrogen: $MN_x$, e.g., $AgN_x$, $TiN_x$, $AlN_x$, etc., and the resistive switching layer comprises a metal-nitrogen: $MN_y$, e.g., $AgO_y$, $TiO_y$, $AlO_y$, and so forth, where y and x are positive numbers (or ranges), and in some cases y is larger than x. In an alternative embodiment of this example, the particle donor layer comprises a metal-oxygen: $MO_x$, e.g., $AgO_x$, $TiO_x$, $AlO_x$, and so on, and the resistive switching layer comprises a metal-oxygen: $MO_y$, e.g., $AgO_y$, $TiO_y$, $AlO_y$, or the like, where y and x are positive numbers (or ranges), and in some cases y is larger than x. In yet another alternative, the metal compound of the particle donor layer is a $MN_x$ (e.g., $AgN_x$, $TiN_x$, $AlN_x$, etc.), and the resistive switching layer is selected from a group consisting of $MO_y$ (e.g., $AgO_y$, $TiO_y$, $AlO_y$, etc.) and $SiO_y$, where x and y are typically non-stoichiometric values, or vice versa in a still further embodiment.

As utilized herein, variables x, y, a, b, and so forth representative of values or ratios of one element with respect to another (or others) in a compound or mixture can have different values (or ranges) suitable for respective compounds/mixtures, and are not intended to denote a same or similar value or ratio among the compounds. Mixtures can refer to non-stoichiometric materials with free elements therein—such as metal-rich nitride or oxide (metal-oxide/nitride with free metal atoms), metal-poor nitride or oxide (metal-oxide/nitride with free oxygen/nitrogen atoms)—as well as other combinations of elements that do not form traditional stoichiometric compounds as understood in the art.

Some embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Following program or erase pulses, a read pulse can be asserted. This read pulse is typically lower in magnitude relative to program or erase pulses and typically insufficient to affect the conductive filament and/or change the state of the two-terminal memory cell. By applying a read pulse to one of the electrodes of the two-terminal memory, a measured current (e.g., $I_{on}$) when compared to a predetermined threshold current can be indicative of the conductive state of the two-terminal memory cell. The threshold current can be preset based on expected current values in different states (e.g., high resistance state current; respective currents of one or more low resistance states, and so forth) of the two-terminal memory device, suitable for a given two-terminal memory technology. When the conductive filament is not extant, the memory cell is said to be in the "off-state". A memory cell being in the on-state or the off-state can be logically mapped to binary values such as, e.g., "1" and "0". It is understood that conventions used herein associated with the state of the cell or the associated logical binary mapping are not intended to be limiting, as other conventions, including an opposite convention can be employed in connection with the disclosed subject matter. Techniques detailed herein are described and illustrated in connection with single-level cell (SLC) memory, but it is understood that the disclosed techniques can also be utilized for multi-level cell (MLC) memory in which a single memory cell can retain a set of measurably distinct states that represent multiple bits of information.

Overview

FIG. 1 illustrates a block diagram of an example integrated circuit device 100 for an electronic device according to one or more embodiments of the present disclosure. Integrated circuit device 100 includes an array(s) 110 of two-terminal resistive-switching memory cells (though other magnetic switching or charge-trapping two-terminal memory cells can be utilized instead or in addition, as described herein or known in the art). Array(s) 110 of memory can include resistive switching memory cells, and different portions of the resistive switching memory cells can be characterized (and re-characterized, where suitable) for different memory cell functions. Example memory cell functions can include physical identifier functions (e.g., physical unclonable feature (PUF), random number generation (RNG)), one-time programmable (OTP) functions and many-time programmable (MTP) functions (also referred to as rewritable or program/erase functions). Different groups of memory cells of array(s) 110 are provided (or can be characterized) to implement these functions. As described herein, identifier functions can be implemented by way of multiple resistive-switching memory cells collectively defined as an identifier bit (or by single cells defining a bit in some embodiments). Thus, depicted in FIG. 1 are PUF memory bits 112, RNG memory bits 118, OTP memory cells 114 as well as MTP or reversibly programmable memory cells 116. Array(s) 110 of resistive-switching memory cells can be characterized for other types of memory cell functions not specifically depicted in FIG. 1, where suitable.

In some disclosed embodiments, one or more of PUF bits 112, OTP bits 114, MTP bits 116 and RNG bits 118 can be located within fixed portions—or sub-arrays—of array(s) 110 of resistive-switching memory cells. As an example, PUF bits 112 and RNG bits 118 embodied by differential identifier bit circuits described herein (e.g., see FIG. 2, infra) can be positioned within a fixed portion of array(s) 110 that is formed to accommodate intrinsic program suppression of multi-cell differential identifier bit circuits as is described in more detail throughout this specification. In such embodiments, OTP bits 114 and MTP bits 116 can be located within other portions—or sub-arrays—of array(s) 110 that do not accommodate intrinsic program suppression of multi-cell differential identifier bit circuits. However, controller 120 can be configured to utilize a PUF sub-array (e.g., see FIG. 2, infra) for OTP bits 114 and MTP bits 116 in some embodiments, or can utilize a MTP/OTP sub-array for PUF bits 112 or RNG bits 118 without intrinsic program suppression, in at least some embodiments of the present disclosure.

Accordingly, although array(s) 100 of resistive-switching memory cells illustrates designated sections of characterized memory cells, in some embodiments spatial orientation, relative or absolute, is not required by the position of the dotted blocks within array(s) 110 of memory identifying PUF, OTP, MTP, or RNG data. Rather, controller 120 can characterize portions of PUF bits 112 as MTP bits 116, portions of OTP bits 114 as RNG bits or PUF bits 112, and various other combinations. Further, array(s) 110 of resistive-switching memory cells can be uncharacterized (e.g., upon initial fabrication), re-characterized (e.g., in response to re-characterization of cells from RNG to MTP, from MTP to OTP, and so forth), or de-characterized (e.g., removing previous characterizations, where suitable), or the like, as suitable. Accordingly, the characterization of memory cells in array(s) 110 is illustrative only, and array(s) 100 can be wholly uncharacterized, have some of the disclosed characterizations, other characterizations that would be evident to one of skill in the art building upon the context of the present disclosure, and so forth.

In at least one alternative or additional embodiment(s), some memory cells of array(s) 110 of two-terminal resistive-switching memory cells can have a fixed size or number of memory cells located within a group of addresses of array(s) 110 of memory pre-assigned to one operational characteristic (e.g., MTP operation, OTP operation, RNG operation, PUF operation, or the like). Some or all of these pre-assigned memory cells could be re-characterized by controller 120 in some aspects of the disclosure, although some pre-assigned memory cell characterizations can be permanent and not re-characterizable in at least one aspect, and depending on design choice. In such embodiments, a host command received by a controller 120 identifying addresses of target memory cells can imply an operation consistent with the pre-assigned operational characteristic associated with those addresses. As an example, a write command targeting memory cell addresses pre-assigned to PUF operational characterization can imply a PUF write command, and so forth. When implementing the write command on memory cells pre-assigned to PUF operation, controller 120 can implement instructions suitable for a PUF write, rather than an MTP write, OTP write, or even a RNG write, as an example. In other embodiments, even where some memory cells of array(s) 110 are pre-assigned a characterization, other memory cells can be un-characterized, and can instead be assigned an operational characterization selected by an end user (or an external host device—not depicted, but see FIG. 12, infra, which could be communicatively coupled to integrated circuit device 100 by way of command/data interface 130 to issue an assignment of operational characterization, or issue a read/write/erase command), where suitable, or can even be dynamically characterized or re-characterized as described herein.

Figure 11:
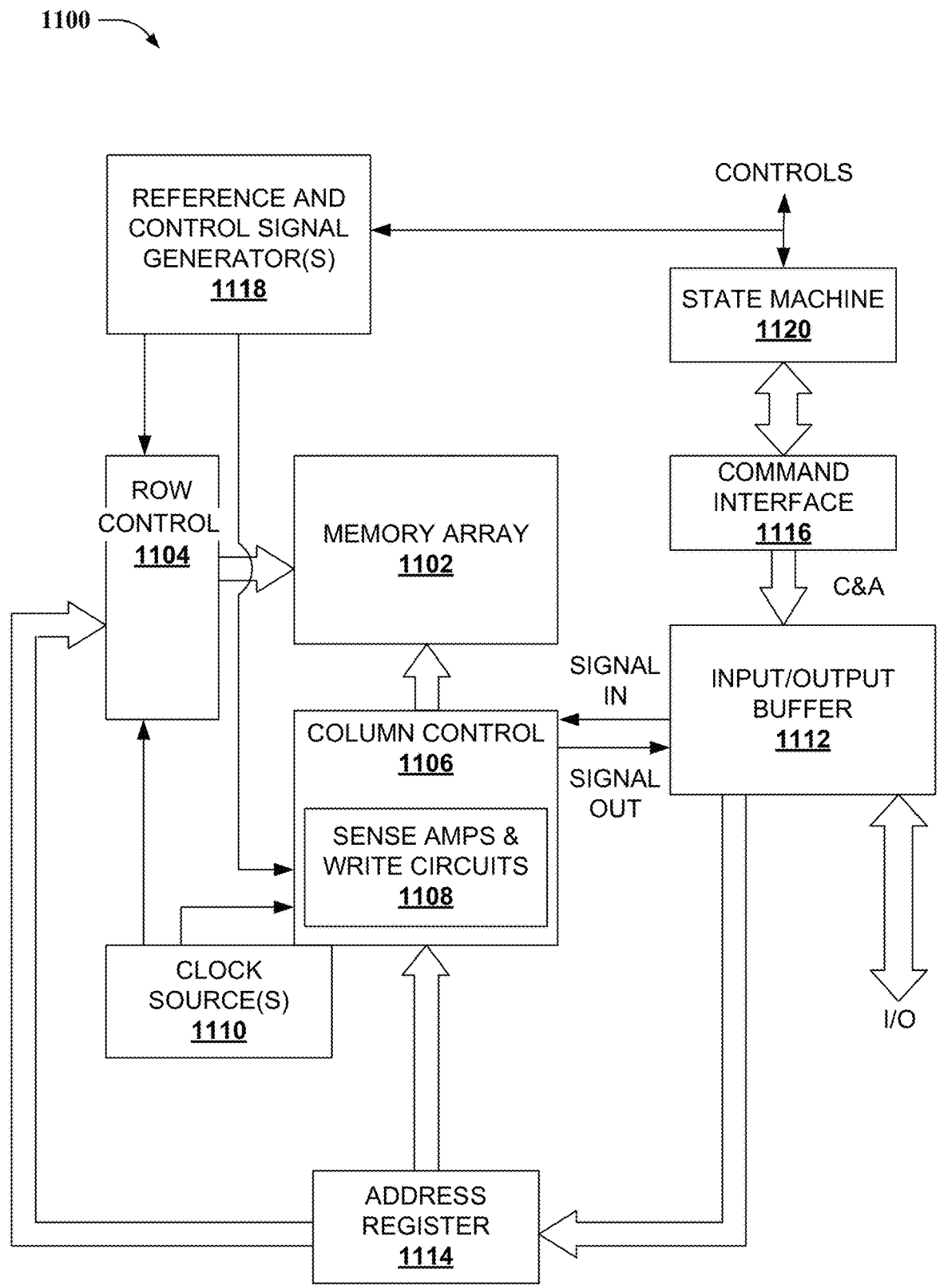
FIG. 11 illustrates a block diagram of an example electronic operating environment in accordance with one or more disclosed embodiments.

Controller 120 is provided to implement memory operations upon array(s) 110 of resistive-switching memory cells (e.g., see also FIG. 11, infra). Memory operations can include processes such as program (write), read, overwrite, erase, and so forth, operations suitable for operation of MTP bits 116. Memory operations can also include processes for program (write) or reading OTP bits 114. Instructions for implementing memory operations according to the various characterizations can be stored in trim instructions 122. Additionally, controller 120 can be configured to characterize different memory cells of array(s) 110 according to a disclosed function: an OTP characterization, an MTP characterization, a RNG characterization, a PUF characterization, or the like, or a suitable combination of the foregoing. Characterization of memory cells can be implemented in response to explicit memory characterization protocols (by way of command/data interface 130, for example), which can be implemented by a manufacturer post-fabrication of integrated circuit device 100, by a distributor or reseller of integrated circuit device 100 after fabrication, by an end-user as part of a chip calibration routine, or as a dynamic process during operation of integrated circuit device 100, or even in response to a host-generated memory command or memory cell characterization command, according to various embodiments. As an illustrative example, a host device communicatively coupled to integrated circuit device 100 can issue a host command to generate PUF data; such a host command can include or imply a PUF characterization protocol on memory bits identified in the host command, or a command to characterize cells as PUF bits 112 can be received separate from a command to generate PUF data from those cells. In various embodiments, trim instructions 122 can store protocols to characterize memory cells according to PUF, RNG, MTP, OTP characterizations, as well as implement memory operations consistent with those characterizations.

Also illustrated in integrated circuit device 100 is an input(s) 140 and output(s) 150. In some embodiments, input(s) 140 can include (or provide a pathway for) data to be stored within array(s) 110 of two-terminal resistive-switching memory cells, such as MTP bits 116 or OTP bits 114. Output(s) 150 can output data stored within resistive switching devices of array(s) 110, including PUF bits 112 and RNG bits 118 as well as OTP bits 114 and MIT bits 116. In some embodiments, output(s) 150 can output data that results from computations utilizing data stored in PUF bits 112 (or RNG bits 118) or stored within MTP bits 116 or OTP bits 114 resulting from such computations, in further embodiments.

A command/data interface 130 is provided to receive memory commands from an external device and respond to those commands. Further, data to be written to array(s) 110 can be received by way of command/data interface 130, and data output from array(s) 110 can be provided over command/data interface 130. In at least some embodiments, controller 120 can dynamically expose selection and (re-) characterization of memory cells of array(s) 110 to an external host device (separate from integrated circuit device 100—not depicted) by way of command/data interface 130. In various example implementations, the external host device can be manufactured separately and communicatively interconnected by one or more network or device interfaces to command/data interface 130 to accomplish this embodiment(s).

In addition to the foregoing, disclosed resistive switching devices have excellent properties for generating identifier data sequences. Such properties include high entropy, which is suitable for generating random or substantially random numbers, low bit error rate (BER), inherent difficulty in reverse engineering or illicit side-channel data access, and fast sensing times. For example, a bit sequence of 128 or 256 identifier (e.g., PUF) bits can be formed from 128 or 256 resistive switching devices or 128/256 groups (e.g., pairs, etc.) of multiple such resistive switching devices (as described in differential identifier bit generation; see FIG. 2 infra). High randomness in generating identifier bits minimizes non-random patterns between bits (resistive switching devices/groups of such devices) of a sequence, mitigating or avoiding false rejection rates.

More specifically, bit error rates (BER)s of identifier data generated with disclosed resistive switching devices are extremely low compared to techniques for generating PUF with static random access memory (SRAM). This allows integrated circuit device 100 to generate highly non-correlated identifier bits without special BER-reducing circuitry permanently affixed to memory cells from which identifier data is generated. Embodiments disclosed herein can utilize row and column selection circuitry (including multiplexers; see FIG. 2, infra) and processes associated with implementing read, write, erase and other memory operations on resistive switching devices (e.g., FIGS. 11 and 12, infra), and extend those circuitry and processes to generating or storing PUF data, RNG data, OTP data, MTP data, and so forth.

In one or more embodiments, controller 120 can be operable to perform memory operations on array(s) 110 of memory. For instance, controller 120 can be operable to perform sensing operations pertaining to generating an identifier data bit from one (or a group of) resistive switching device(s) operably characterized as PUF bits 112 (or RNG bits 118), in an embodiment(s). Examples of non-differential sensing operations pertaining to generating an identifier bit from a single memory cell can include: native current of a never-programmed resistive switching device in the context of PUF data (or leak current of an un-programmed device in the context of RNG data) in response to a sub-program voltage, native electrical resistance of a resistive switching device, detection of program events, detection of speed or timing of program events, a program voltage, a program current, an on-state (programmed) resistance, an erase voltage or current, a delay frequency, a parasitic resistance or capacitance, a program or erase minimum pulse width, and so forth, or suitable combinations of the foregoing, as described herein (or as described within U.S. application Ser. No. 17/223,817 incorporated by reference hereinabove). In general, however, these sensing operations can be digitized to generate PUF or RNG data by comparing a measured result of a sensing operation (native current in response to sub-program voltage, detection of program event in response to a program signal, speed or timing of program event, a voltage at which a device becomes programmed, and so forth) to a threshold value stored in trim instructions 122 of controller 120. Generation of PUF data usually involves never-programmed resistive switching memory cells, whereas generation of RNG data can involve never-programmed cells, or un-programmed cells with relatively low program counts (e.g., fewer than 10 program events; fewer than 50 program events; fewer than 100 program events; fewer than 1000 program events; or other suitable value, or any suitable value or range there between), although the subject disclosure is not strictly limited to these definitions.

As further examples, controller 120 can be operable to perform a program operation(s) pertaining to generating an identifier data bit utilizing an identifier memory cell(s) 112, 118 of array(s) 110 of memory. Examples of such program operations include applying a program voltage magnitude to a never-programmed (or un-programmed for RNG data) memory cell and determining whether the cell is programmed or not programmed in response to the selected program voltage magnitude (program voltage magnitude differentiation). The identifier data bit can be digitized by assigning a '1' if the cell is programmed, and '0' if not programmed (or vice versa). Further examples include applying a program signal of selected pulse duration to a never-programmed (or un-programmed) memory cell and determining whether the cell is programmed or not programmed after the selected pulse duration (program time differentiation). Similar to the previous example, the identifier data bit can be digitized by assigning a '1' if the cell is programmed, and '0' if not programmed (or vice versa). Another example includes applying a sub-program voltage to a never-programmed (or un-programmed) memory cell and determining whether a native (or leak) non-programmed current is above or below a preselected current threshold (native/leak current differentiation). The identifier bit can be digitized by assigning a '1' if native current is above the threshold and assigning a '0' if native current is below the threshold (or vice versa). Other examples or combinations of the foregoing known in the art or reasonably suggested to one of ordinary skill in the art by way of the context provided herein are considered within the scope of the present disclosure.

In still other embodiments, controller 120 can be configured to implement differential operations pertaining to generating an identifier bit from a plurality of resistive switching devices. Generally, differential operations compare response of one or more cells of a plurality of memory cells to a memory operation and digitize an identifier bit associated with the plurality of memory cells based on relative responses of the one or more memory cells. Differential operations usable to generate an identifier bit according to aspects of the present disclosure can include: differential program speed of a group of never (or un) programmed memory cells, differential native program voltage of the group of memory cells, differential native (leak) current of the group of memory cells, differential native electrical resistance of the group of memory cells, differential on-state resistance of the group of memory cells, differential erase voltage or current of the group of memory cells, differential delay frequency of the group of memory cells, differential parasitic resistance or capacitance of the group of memory cells, a differential program or erase minimum pulse width or duration of the group of memory cells, or the like, or a suitable combination of the foregoing. For differential operations, using the exemplary case of two cells per identifier bit (though the rule can be extended to three or more cells per identifier bit through proportional logic, optionally for generating multi-bit identifier data with suitable numbers of differential cells), the identifier bit can be digitized by assigning a '0' value to identifier bits in which a first memory cell has higher (or lower) native current/on-state resistance/erase voltage/delay frequency/parasitic resistance or capacitance/program or erase speed, etc., and assigning a '1' to identifier bits in which a second memory cell has the higher (or lower) native current/on-state resistance/erase voltage/delay frequency/parasitic resistance or capacitance/program or erase speed, and so forth. Rules for digitizing identifier bits utilizing differential operations on multiple memory cells can be stored in trim instructions 122, in an embodiment or elsewhere in controller 120 or integrated circuit device 100.

Embodiments of the present disclosure provide improved differential programming of multiple resistive switching memory cells that define an identifier bit. In one aspect of such embodiments, array control circuitry 124 is provided that can include a detection circuit to detect a program event(s) for a first of the multiple resistive switching memory cells (or a first group of such cells). Additionally, array control circuitry 124 can include a termination circuit configured to disconnect the multiple resistive switching memory cells from program voltage in response to detection of the program event(s). This disconnection from program voltage can occur prior to completion of a program cycle associated with the differential programming, as an example (see, for instance, FIGS. 6 and 7, infra). In at least some embodiments, array control circuitry 124 (or array(s) 110 itself) can provide a common node that can be selectively activated to electrically connect second terminals of the multiple resistive switching memory cells for the differential programming to facilitate intrinsic suppression of an unprogrammed memory cell (or group of such cells) in response to the program event. The intrinsic suppression of unprogrammed memory cells can be very rapid (e.g., less than 10 nanoseconds, ns), greatly mitigating unexpected program events for the differential programming of the identifier bit (e.g., see FIG. 3, infra).

In yet other embodiments, controller 120 can be operable to selectively implement one-time programmable operations on selected PUF bits 112 to render permanent a PUF bit sequence generated with a program event at a set of PUF bits 112 (or, e.g., stored at a set of memory cells in response to generation at other memory cells by a non-program event, such as native leak current or the like). Described differently, a PUF data sequence comprising program and un-programmed bits can be reinforced with a strong program pulse, e.g., a one-time programmable pulse, to make program bits of the PUF data sequence non-erasable and create large sensing margin between the program bits and the un-programmed bits of the PUF data sequence. This can serve to greatly enhance longevity and accurate read cycle counts of the PUF bit sequence.

In still additional embodiments, controller 120 can be operable to establish one or more threshold metric levels (e.g., current level(s), resistance level(s), program voltage level(s), program speed level(s), etc.) for defining identifier bit values (e.g., logic levels; a '0' bit and a '1' bit in the binary context) from sensing operations or program operations performed on identifier memory cells 112, 118, as described herein. As an illustrative example, if an operational characteristic selected to generate identifier bit data is a native leak current, a current value threshold (or small range of values) (e.g., 500 nA, or any other suitable value or range) can be selected and resistive switching devices above the current value threshold can be allocated a '1' identifier bit value and devices below the current value threshold can be allocated a '0' identifier bit value. In other embodiments, a range of threshold values with a lower threshold and an upper threshold (e.g., a lower threshold of 400 nA and an upper threshold of 600 nA, or any other suitable threshold value or range of values) can be utilized. Devices with native current below 400 nA can be allocated a '0' identifier bit value; devices with native current above 600 nA can be allocated a '1' identifier bit value, and devices between 400 nA and 600 nA can be discarded, in an embodiment. In an embodiment, further read operations can use a 500 nA threshold to regenerate the '0' bit values and '1' bit values. Using lower and higher initial threshold values can increase sensing margin and reduce bit error rates, according to embodiments of the present disclosure.

It should be appreciated that a suitable threshold or set of thresholds can be established for other resistive switching device operational characteristics selected for generating identifier bit information. As another (non-limited) illustrative example, a logic level 0 can be associated with a program voltage of 2 volts or higher and a logic level 1 associated with a program voltage of 1.8 volts or below. As stated previously, other suitable thresholds can be used to define logic level values for identifier bits as disclosed herein. In some embodiments, when a large number of resistive switching devices are sensed as part of generating identifier bits, a threshold voltage, current, pulse width etc., can be selected such that approximately half of the devices become associated with a logic level 0 and another half become associated with a logic level 1. In some embodiments, threshold settings can be performed manually by way of controller 120; in other embodiments default threshold settings can be set (optionally stored in trim instructions 122) upon initializing a semiconductor chip.

In addition to the foregoing, controller 120 can be configured to define an arrangement or ordering of resistive switching devices (or groups of resistive switching devices) to create a multi-bit sequence of identifier bits. As one illustrative example, resistive switching devices 0:7 can be read and assigned to bits 0:7 of a bit sequence. In an alternative embodiment utilizing pairs of switching devices to a define an identifier bit—first resistive switching devices 0:7 in a block of array(s) 110 can be associated with second resistive switching devices (n: n+8) elsewhere in the block of the array(s) 110 (or in another block of the array(s) 110) by controller 120 to define identifier bits 0:7 of a (differential) bit sequence. The variable: n can be any suitable number greater than 7 if in the same block, or any number if in a different block or on a different wordline of the block. However, in particular embodiments the number n can be a multiple of the size of the bit sequence, e.g., for an 8-bit identifier sequence a multiple of n=8:8, 16, 24, 32, . . . , 128, 256, 512, and so forth. In other embodiments, the bit sequence need not be derived from resistive switching devices arrayed in a particular order (consecutive or otherwise). As an example, from an ordinal line of resistive switching devices, devices 15, 90, 7, 21, 50, 2, 37, 19 (and suitable associated groups of other resistive switching devices in the differential programming context, where multiple resistive switching devices define each identifier bit) can be read and respectively assigned to bits 0:7 of an output bit string. The bit string can be of any selected length, defined by a matching number of resistive switching devices (or multiples of the matching number in the differential context). For instance, bit strings of 64 bits, 256 bits, 1024 bits, 64 kbits, or any other suitable subset of identifier memory cells 112, 118 up to all of identifier memory cells 112, 118 (which can include all of array(s) 110 of memory in at least some embodiments) may be employed for a bit string. As another non-limiting illustration, for a 256-bit PUF data sequence utilized for a cryptographic key, controller 120 can characterize a set of memory cells as PUF bits and define an ordering of resistive switching memory cells assigned to the PUF bits to correspond with a sequence of 256 bits. Bit values (e.g., logic levels, ...) generated from the assigned resistive switching memory cells can then be ordered by controller 120 consistent with the device(s) ordering to thereby create the 256-bit identifier sequence. As a specific illustration: where a row of 256 resistive switching devices in an array is selected for generating an identifier sequence, identifier bit values of the 256 resistive switching devices can be arranged in the order the resistive switching devices are physically situated in the row; however, this is an illustrative example only and any other suitable arrangement or ordering can be implemented by controller 120 as an alternative or in addition.

In should be understood that operations, configurations, characteristics and various illustrations and descriptions of controller 120 can be applicable to other controllers disclosed herein in various embodiments (e.g., with reference to FIG. 11, infra, memory array 1102 and components of operating environment 1100 configured for control of operations of memory array 1102). Conversely, operations, configurations, characteristics and various illustrations and descriptions of other controllers disclosed herein can be applicable to controller 120 in one or more embodiments.

Although presented briefly above, and now in more detail: rules for establishing a subset of switching devices of array(s) 110 according to a disclosed operational characterization can be stored in trim instructions 122. Trim instructions 122 can comprise rules for storing operational characterizations of the available characterizations of resistive-switching memory cells of array(s) 110, rules for identifying (and storing) memory cell addresses having one of the specified characterizations, rules for performing operations upon characterized switching devices consistent with the characterization, and so forth. For instance, trim instructions 122 can store rules for characterizing one or more groups of resistive switching devices of array(s) 110 as PUF bits 112, rules for coupling multiple resistive switching devices to form differential PUF bits in some embodiments (e.g., see FIGS. 2 and 3, infra), rules for performing a PUF operation on a group of resistive switching devices characterized as PUF bits 112, such as a PUF write (to generate PUF bits) or a PUF read (to read data generated with a PUF write and stored at cells generating the data, stored at a portion of the cells generating the data, or stored at other cells within array(s) of memory 110, according to various embodiments), and rules for re-characterizing resistive switching devices as OTP bits 114, MTP bits 116 or RNG bits 118 previously characterized as PUF bits 112, or rules for de-characterizing previously characterized bits. Trim instructions 122 can likewise store rules for characterizing one or more groups of resistive switching devices as OTP bits 114, MTP bits 116 or RNG bits 118, rules for coupling multiple resistive switching devices to form differential RNG bits (e.g., in a similar manner as provided herein for differential PUF bits, extended to un-programmed memory cells with low write counts), rules for performing an OTP, MTP or RNG operation, and rules for re-characterizing OTP bits 114, MTP bits 116 or RNG bits 118 as other characterizations (where suitable), or no characterization (e.g., utilizing default or conventional trim instructions in at least one embodiment).

To implement operations on memory cells consistent with a previous characterization, controller 120 can reference saved characterizations for groups of memory cells (e.g., stored in trim instructions 122 or elsewhere on integrated circuit device 100, such as within array(s) 110 itself) and obtain from trim instructions 122 suitable signal characteristics for a memory operation consistent with the characterization. Suitable signal characteristics can include: a voltage magnitude(s), current compliance, signal duration, dynamic voltage pulse as a function of time, and so forth. For a PUF write, for instance, trim instructions 122 can store suitable signal characteristics for various PUF write modalities described herein (e.g., utilizing native current, native electrical resistance, detected program event(s), among others). Trim instructions 122 can also store suitable inhibition signals for memory cells neighboring a cell(s) being operated upon, a termination condition(s) for terminating an operation signal, among other signal operations employed for implementing memory operations or identifier operations on resistive switching devices as known in the art or described herein. Likewise, trim instructions 122 can store suitable signal characteristics, inhibit signal characteristics, termination conditions, and so forth, for other disclosed identifier bit sensing operations. Further, trim instructions 122 can store rules for aggregating multiple memory cells to form a differential identifier bit, for differential PUF or RNG memory operation, and for aggregating groups of multiple memory cells to create multiple differential identifier bits to generate a sequence of PUF data or RNG data. Other operational rules, configurations, settings and the like can be stored in trim instructions 122 as disclosed herein, as known in the art or as reasonably conveyed to one of ordinary skill in the art by way of the context disclosed herein. For instance, trim instructions 122 can specify a subset of multiple memory cells defining a PUF bit (e.g., one memory cell of a pair of memory cells defining the PUF bit; two memory cells of four memory cells defining the PUF bit, etc.) as storing a data value for the PUF bit generated in response to a differential program protocol.

Figure 2:
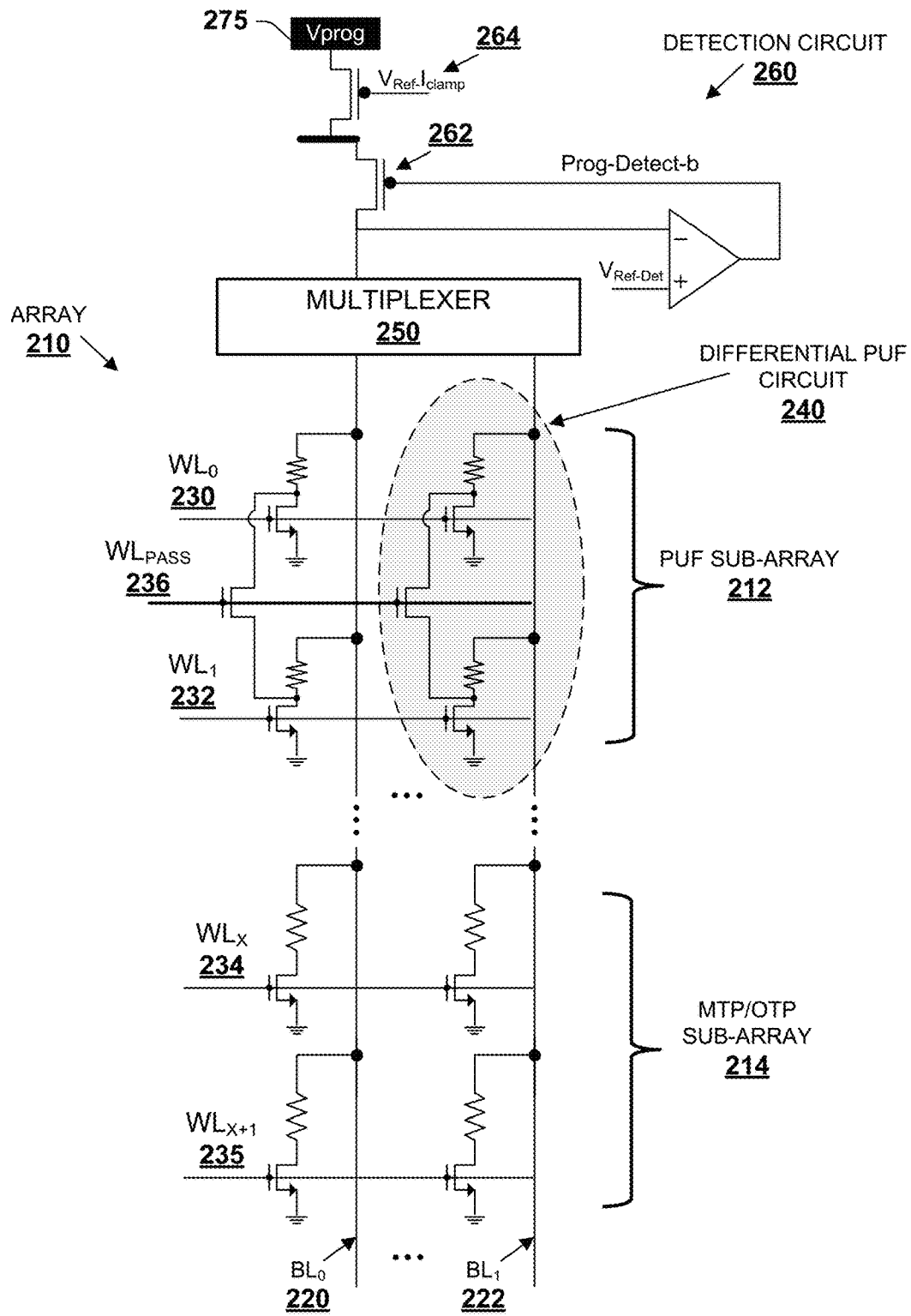
FIG. 2 illustrates an example circuit diagram of a differential ReMEM array including a physical unclonable feature (PUF) ReMEM circuit, in further embodiments.

Referring now to FIG. 2, there is disclosed a differential ReMEM array circuit 200 according to various embodiments of the present disclosure. Differential ReMEM array circuit 200 includes an array 210 defining multiple sub-arrays. A PUF sub-array 212 includes differential identifier circuits comprising multiple resistive memory cells. A differential PUF circuit 240 is shown, though PUF-sub-array 212 can include differential RNG circuits as well. Generally, a differential PUF circuit 240 will comprise resistive memory cells having never been programmed or programmed less than a threshold number of times (e.g., 1, 2, 5, etc.), whereas a differential RNG sub-array will comprise resistive memory cells having been programmed more than the threshold number of times, and optionally less than a second threshold number of times (e.g., 50, 100, 1000, etc.). Differential PUF circuit 240 can also comprise resistive memory cells storing PUF data—generated by a differential PUF write process, and likewise differential RNG circuits can comprise resistive memory cells storing RNG data—generated by a differential RNG write process.

PUF-subarray 212 includes a set of bitlines, including $BL_0$ 220 and $BL_1$ 222 (referred to collectively as bitlines 220-222), and a set of wordlines including $WL_0$ 230 and $WL_1$ 232. A pass wordline 236 is also shown. Wordlines $WL_0$ 230 and $WL_1$ 232 will be referred to hereinafter collectively as wordlines 230-232, whereas pass wordline 236 will be referred to separately. In addition, array 210 includes a MTP/OTP sub-array 214. This sub-array of array 210 also includes bitlines 220-222 with different wordlines: including wordline $WL_X$ 234 and wordline$_{X+1}$ 235, referred to collectively as wordlines 234-235. Note that MTP/OTP 214 is depicted without a pass wordline 236; although in at least some embodiments a pass wordline can be provided between wordlines 234-235.

Figure 3:
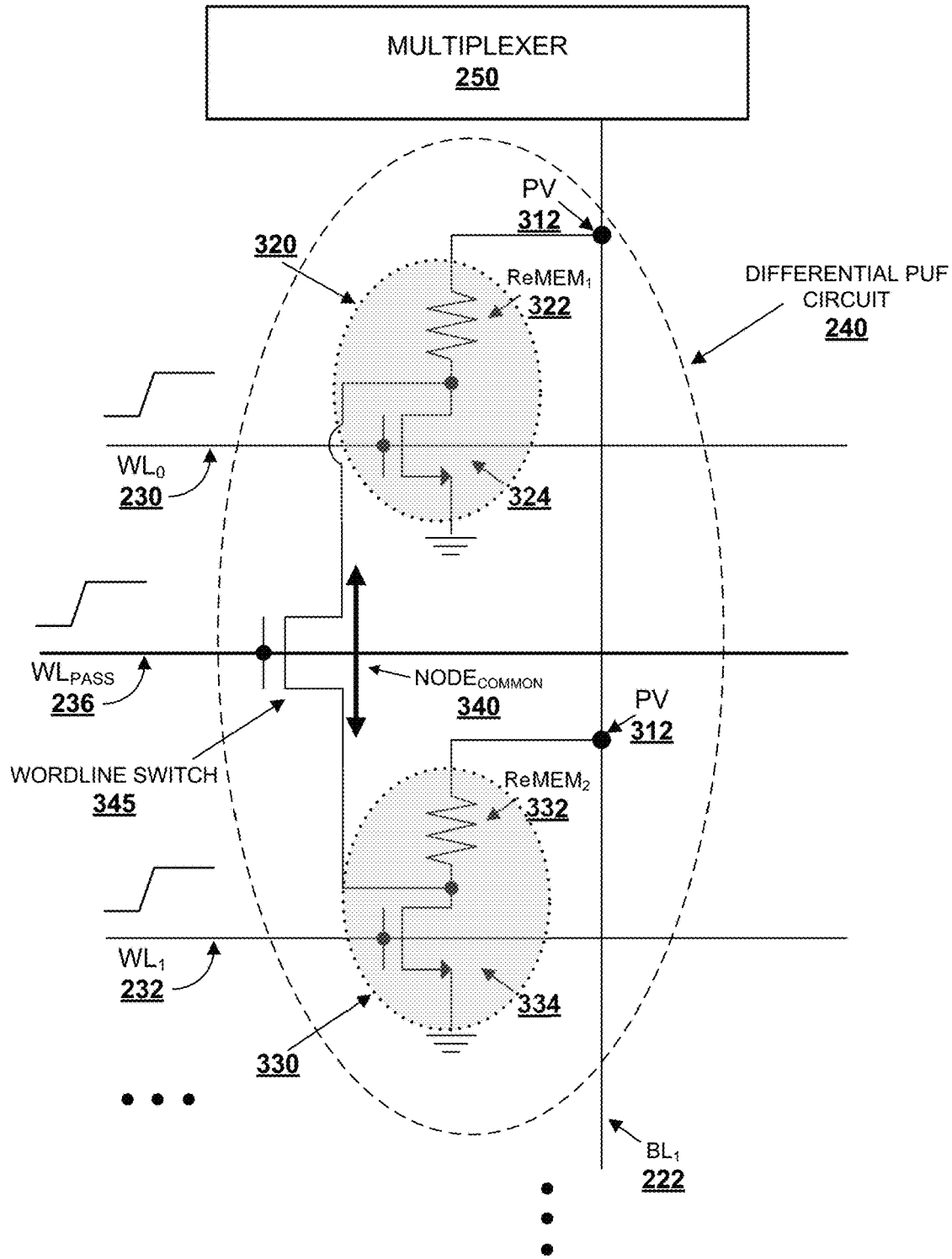
FIG. 3 depicts a schematic diagram of an example single-bitline PUF circuit for differential programming, in additional embodiments.

Differential PUF circuit 240 can include a first one-transistor, one-resistor (1T1R) memory circuit and a second 1T1R memory circuit, as is described in more detail at FIG. 3, infra. Further, a pass transistor having a gate node coupled to pass wordline 236 can be activated to electrically connect second terminals of resistive memory cells of the 1T1R memory circuits, and can be deactivated to electrically disconnect or isolate the second terminals of the resistive memory cells of the 1T1R memory circuits from each other. A transistor of a first 1T1R memory circuit has a gate node coupled to $WL_0$ 230 to connect or disconnect the resistive memory cell of the first 1T1R memory circuit to ground (or a low/opposite polarity voltage, as suitable). Similarly, a transistor of the second 1T1R memory circuit has a gate node coupled to $WL_1$ 232 to connect or disconnect the resistive memory cell of the second 1T1R memory circuit to ground (or low/opposite polarity voltage).

A multiplexer 250 is connected to bitlines 220-222 and is configured to selectively connect or disconnect any subset of bitlines 220-222 (including no bitlines and all bitlines) to a power source 275. Interconnection of multiplexer 250 with power source 275 can be through a voltage reference and current clamping transistor 264, in some embodiments. Further, interconnection of multiplexer 250 with power source 275 can be through a shut-off transistor 262 of a detection circuit 260, in further embodiments, as described in more detail hereinbelow (e.g., see FIGS. 6 and 7, infra).

Of note, differential PUF circuits 240 (and differential RNG circuits) are coupled to a single bitline of bitlines 220-222. For example, differential PUF circuit 240 highlighted by the dashed oval in FIG. 2 is coupled to $BL_1$ 222 but is not coupled to $BL_0$ 220. Accordingly, differential memory operations applied to differential PUF circuit 240 are implemented through bitline $BL_1$ 222 (and wordlines 230-232) and are independent of bitline $BL_0$ 220. Thus, a PUF write operation, PUF read operation, and program detection functions are implemented on $BL_1$ 222 utilizing wordlines 230-232 (and optionally pass wordline 236).

FIG. 3 depicts an operational diagram 300 for a PUF write operation of differential PUF circuit 240 according to additional embodiments of the present disclosure. To implement the PUF write operation for differential PUF circuit 240, a program voltage (e.g., provided by program supply 275 of FIG. 2, supra) is supplied to multiplexer 250 and connected within multiplexer 250 to $BL_1$ 222. This results in program voltage 312 applied at a first terminal of a resistive memory$_1$ 322 of first 1T1R memory circuit 320 coupled to $BL_1$ 222, and program voltage 312 applied at a first terminal of a second resistive memory$_2$ 332 of second 1T1R memory circuit 330 also coupled to $BL_1$ 222.

In addition, pass wordline 236 is activated with a high voltage, as shown by the signal diagram going from low to high on pass wordline 236. The high signal on pass wordline 236 activates wordline switch 345 by way of a gate node coupled to pass wordline 236. As a result, a channel node of wordline switch 345 becomes electrically conductive and become a common node 340 between second terminals of resistive memory$_1$ 322 and resistive memory$_2$ 332, as shown in operational diagram 300. Further, wordlines 230-232 become activated (e.g., concurrently) as shown by respective signal diagrams going from low signal to high signal. This activates transistor 324 of 1T1R memory circuit 320 and activates transistor 334 of 1T1R memory circuit 330, coupling the second terminals of resistive memory$_1$ 322 and of resistive memory$_2$ 332 to ground (or to a low voltage, or opposite polarity voltage from program voltage 312, as suitable for a program operation of the resistive memory cell technology employed for differential PUF circuit 240). Accordingly, the program voltage 312 is applied as a potential difference across resistive memory$_1$ 322 and resistive memory$_2$ 332.

FIG. 3 illustrates a common source arrangement for 1T1R memory circuit 320 (and for 1T1R memory circuit 330), in which the ReMEM$_1$ 322 is coupled to $BL_1$ 222 and ReMEM$_2$ 332 is also coupled to $BL_1$ 222. However, the subject disclosure is not limited to this arrangement. For instance, alternative embodiments support a source-follower configuration in addition or instead. In this source-follower configuration the transistors are swapped in electrical series with the ReMEM cells. Thus, transistor 324 is coupled at a first channel node (source or drain) to $BL_1$ 222 and coupled at a second channel node (drain/source) to a first terminal of ReMEM$_1$ 322, whose second terminal is coupled to ground. Likewise, for ReMEM$_2$ 332 the source-follower configuration has transistor 334 coupled to $BL_1$ 222 and to a first terminal of ReMEM$_2$ 332, whose second terminal is coupled to ground.

In response to the program voltage 312 across resistive memory$_1$ 322 and resistive memory$_2$ 332, either memory cell can become programmed to a low resistance state. As an example, take the case where resistive memory$_1$ 322 becomes programmed to the low resistance state. Previously when unprogrammed and in a high resistance state, the electrical resistance from program voltage 312 (incorporating line resistance on $BL_1$ 222), the high electrical resistance of unprogrammed resistive memory$_1$ 322 and low electrical resistance of activated transistor 324 is dominated by the high electrical resistance of unprogrammed resistive memory$_1$ 322. This results in almost all voltage across 1T1R memory circuit 320 being dropped across the dominant resistance of resistive memory$_1$ 322, such that approximately program voltage 312 (e.g., about 3 volts) appears at the first terminal of resistive memory$_1$ 322 and approximately zero volts appears at the second terminal of resistive memory$_1$ 322. When resistive memory$_1$ 322 becomes programmed to a low resistance state, the line resistance on $BL_1$ 222 and low electrical resistance of activated transistor 324 become relevant, causing the voltage provided by $BL_1$ 222 to be divided in proportion to the relative electrical resistances at the first terminal of resistive memory$_1$ 322 and at the second terminal of resistive memory$_1$ 322. This effectively pulls the voltage at the second terminal of resistive memory$_1$ 322 up from about zero to a moderate voltage, such as within a range from about 0.3 volts to about 1.5 volts, or any value or range there between (e.g., 0.4 volts, 0.5 volts, 0.6, volts . . . 1.3 volts, 1.4 volts; or 0.3 volts to 1.2 volts; 0.4 volts to 1 volt; 0.5 volts to 0.9 volts, and so on). For the purposes of this example, the voltage of the second terminal of resistive memory$_1$ 322 is pulled up to about 1 volt.

Because common node 340 electrically couples second terminals of resistive memory$_1$ 322 and resistive memory$_2$ 332, the pullup voltage at the second terminal of resistive memory$_1$ 322 (e.g., 0.3 volts to 1.5 volts; or approximately 1 volt for purposes of this illustrative example) will also be applied at the second terminal of resistive memory$_2$ 332. This reduces the voltage dropped across resistive memory$_2$ 332 to =V$_{PROGRAM}$-V$_{PULLUP}$, or descriptively: program voltage 312-the pullup voltage. In various disclosed embodiments, program voltage 312, the pullup voltage or both can be selected to result in program voltage 312-the pullup voltage=a sub-program voltage, insufficient to cause resistive memory$_2$ 332 to become programmed to a low resistance state. As a result, in response to resistive memory$_1$ 322 becoming programmed to the low resistance state, resistive memory$_2$ 332 is suppressed from becoming programmed to the low resistance state. For differential programming this is quite beneficial as it avoids a potential digital error condition where both cells become programmed, e.g., when trim instructions 122 of controller 120 define only two valid states for a differential PUF circuit 240. Due to the nature of common node 340, the reverse is also true. In response to resistive memory$_2$ 332 becoming programmed to the low resistance state, resistive memory$_1$ is also suppressed from becoming programmed to the low resistance state. Moreover, this intrinsic suppression can happen very rapidly: less than 10 nanoseconds (ns), less than 8 ns, less than 5 ns, less than 3 ns, etc., depending on resistance of wordline switch 345, which also can be selected to achieve a desired intrinsic suppression time (e.g., of less than 10 ns).

Figure 4:
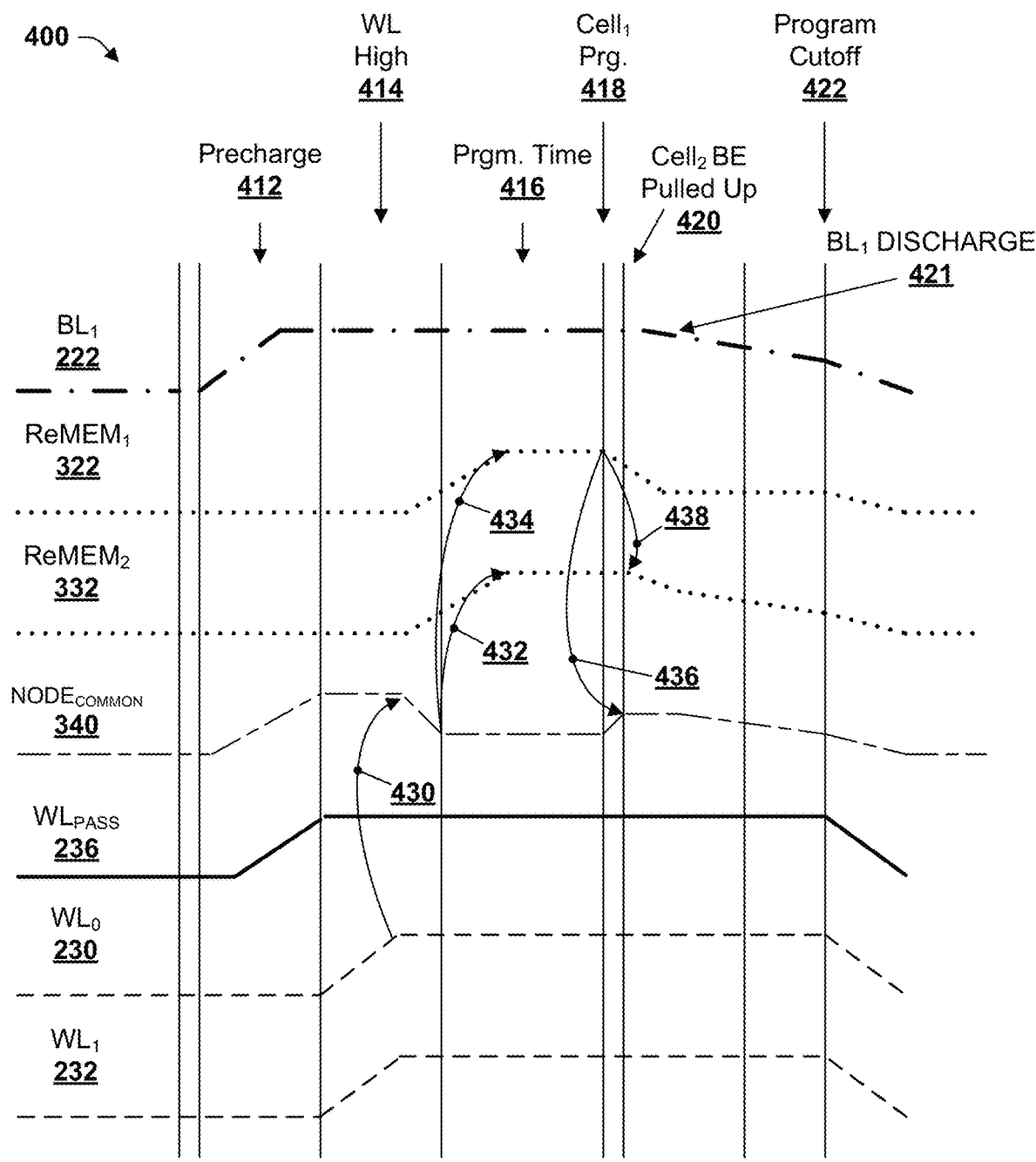
FIG. 4 depicts an example signal timing diagram for the single-bitline PUF circuit of FIG. 3, in an embodiment(s).

FIG. 4 illustrates a signal timing diagram 400 for the differential PUF circuit of FIG. 3. Timing diagram 400 displays signal levels for various nodes of operational diagram 300, including BL$_1$ 222, ReMEM$_1$ 312, ReMEM$_2$ 322, common node 340, WL$_{PASS}$ 236, WL$_0$ 230 and WL$_1$ 232 on a vertical axis, with changes over time displayed on a horizontal axis.

During a precharge phase 412, a high signal equal to a program voltage 312 is applied to BL$_1$ 222 and appears at first terminals of ReMEM$_1$ 322 and ReMEM$_2$ 332. This results in an increase in voltage at second terminals of the resistive memory cells and at common node 340, since transistors 324, 334 are still deactivated and have very high resistance. Additionally, a high signal suitable to activate wordline switch 345 is supplied to WL$_{PASS}$ 236, equalizing voltage at common node 340.

A wordline high phase 414 is initiated causing high signals on wordlines 230-232. This activates transistors 324, 334 concurrently to very low resistance, coupling common node 340 to low voltage (or ground). This causes voltage at common node 340 to drop as shown by reference 430, initiating a program phase 416 for ReMEM$_1$ 322 and ReMEM$_2$ 332 in which voltage dropped across ReMEM$_1$ 322 and ReMEM$_2$ 332 rises to a program voltage. In the example shown in FIG. 4, ReMEM$_1$ 322 becomes programmed to a low resistance state at cell$_1$ program phase 418. In other embodiments, ReMEM$_2$ 332 could become programmed to the low resistance state instead, which would modify timing diagram 400 as would be understood by one of ordinary skill in the art.

In response to cell$_1$ program phase 418, common node 340 is pulled up and voltage across ReMEM$_2$ 332 is reduced as shown in ce$_{112}$ bottom electrode pulled up 420 phase, and reference numbers 436 and 348. Further, BL$_1$ discharges through the programmed cell which now has a much lower resistance to ground through ReMEM$_1$ 322 in the low resistance state and transistor 324 being activated. At program cutoff 422 a program cycle ends and signals go low on the various nodes.

Figure 5:
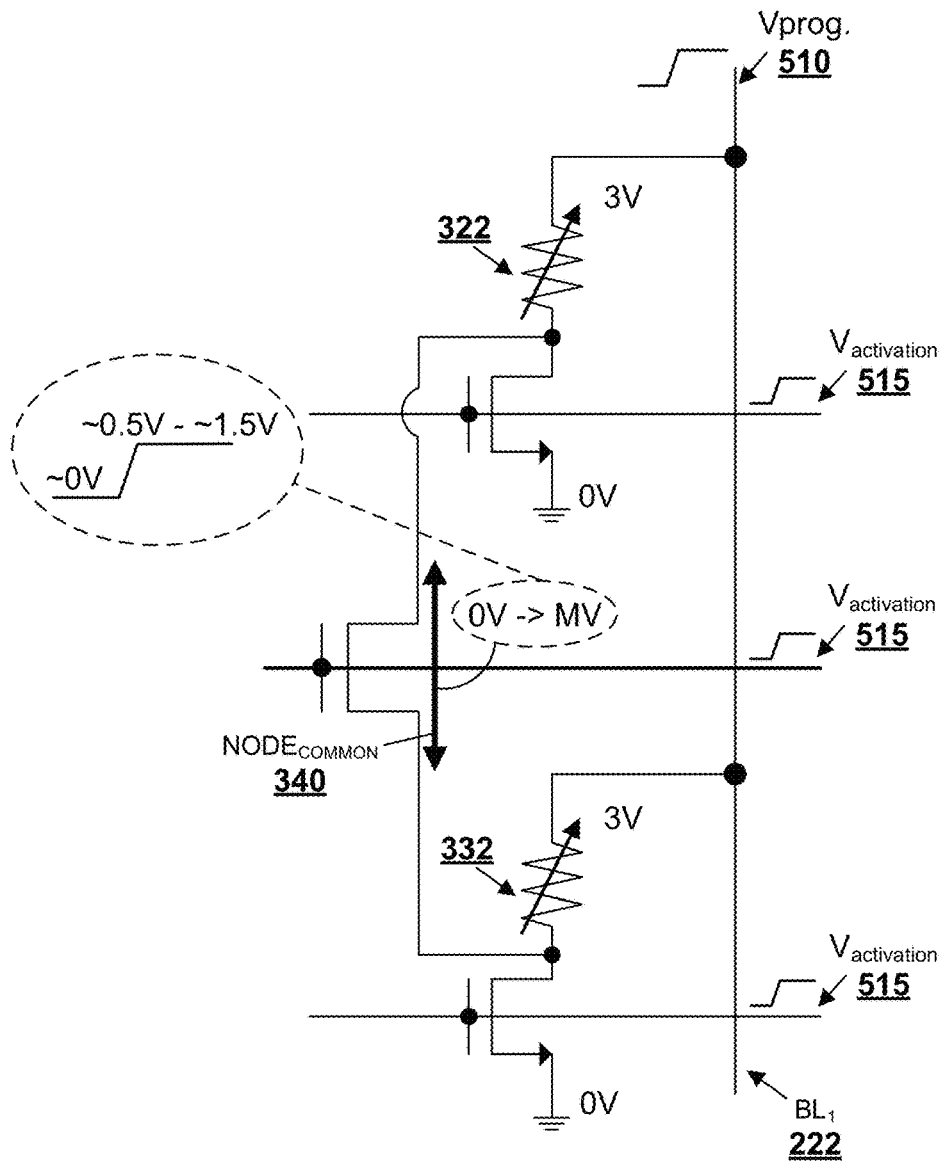
FIG. 5 illustrates a differential program operation for an example single-bitline PUF circuit incorporating intrinsic program suppression, in another embodiment(s).

FIG. 5 illustrates an example schematic diagram for a differential PUF program event 500 according to further embodiments. PUF program event 500 shows program voltage 510 applied to BL$_1$ 222 and activation voltages 515 applied to wordlines 230-232 and to pass wordline 236. This results in activation of wordline switch 345 to couple common node 340 to respective second terminals of resistive memory$_1$ 322 and resistive memory$_2$ 332, and to couple those second terminals and common node 340 to ground through transistors 324 and 334. Accordingly, the program voltage (e.g., ~3V) appears at first terminals of resistive memory$_1$ 322 and resistive memory$_2$ 332 and zero volts across channel regions of transistors 324 and 334, as shown.

In response to one of: resistive memory$_1$ 322 and resistive memory$_2$ 332 programming to a low resistance state, common node 340 rapidly rises from about 0 volts to a moderate voltage. In various embodiments, depending on relative resistance of the resistive memory cell in the program state, resistance of transistor 324 or 334 in the activated state and resistance on bitline$_1$ 222, this moderate voltage can be between about 0.3 volts and about 1.5 volts, or any suitable value or range there between (e.g., depicted as about ~0.5v to ~1.5v in FIG. 5, but not limited to this range). The increase of common node 340 to the moderate voltage intrinsically reduces the voltage dropped across the unprogrammed memory cell to 3V-moderate voltage, which is selected to be less than a program voltage associated with causing the unprogrammed memory cell to transition to the low resistance state. Accordingly, response to a first of: resistive memory$_1$ 322 and resistive memory$_2$ 332 becoming programmed, a second of: resistive memory$_1$ 322 and resistive memory$_2$ 332 is suppressed from becoming programmed.

Figure 6:
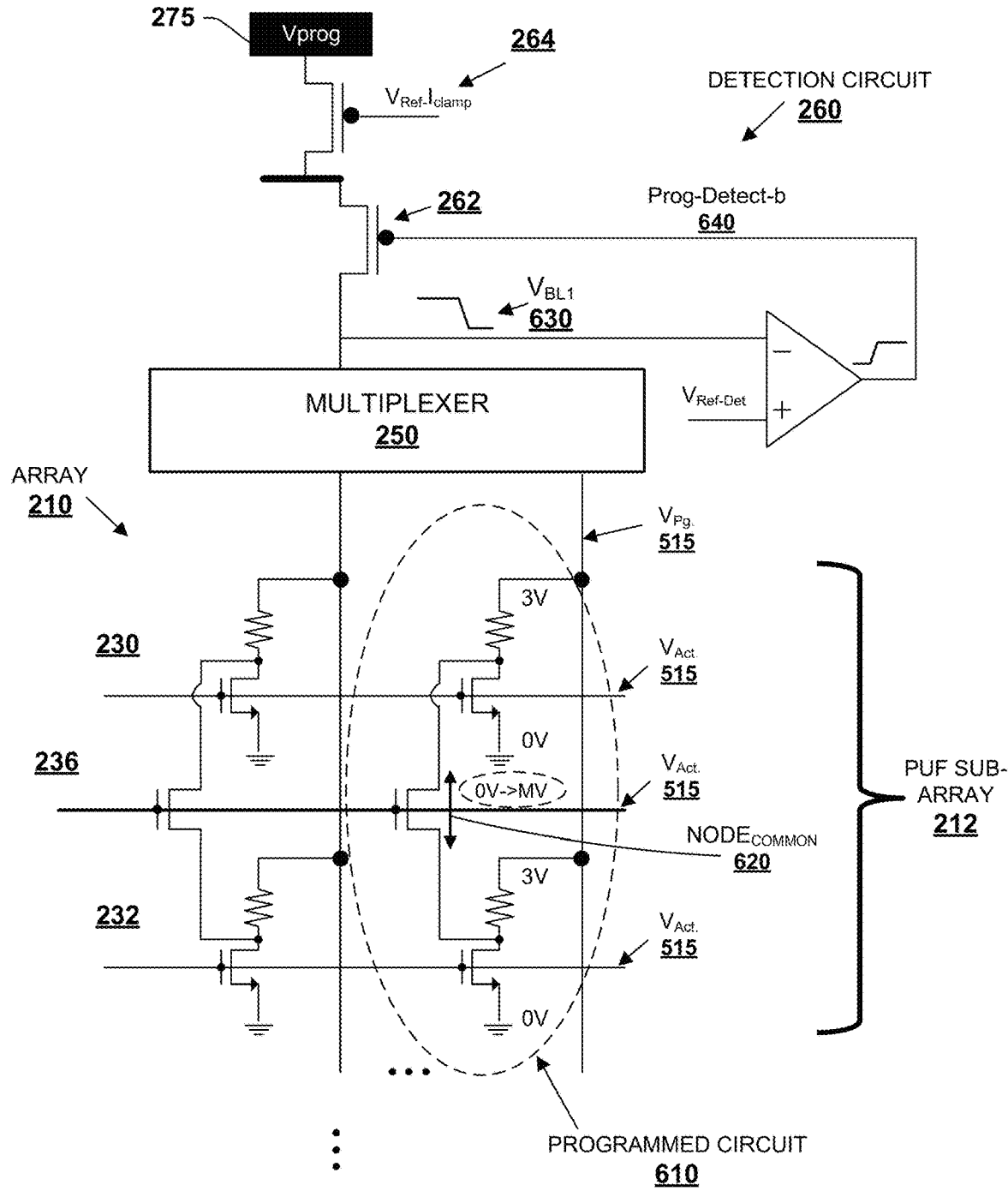
FIG. 6 depicts a schematic diagram of an example single-bitline PUF circuit with intrinsic program suppression, program sensing and disablement, in other embodiments.

FIG. 6 illustrates a schematic diagram of a differential ReMEM program and detection circuit 600 according to further embodiments of the present disclosure. Array 210 is shown in part including PUF sub-array 212. A programmed circuit 610 is depicted in which common node 620 has transitioned to a moderate voltage in response to one of the memory cells becoming programmed to the low resistance state. This programming to low resistance also provides a relatively low resistance path to ground for bitline 222, pulling voltage on bitline$_1$ 222 low 630. This low voltage 630 on bitline$_1$ 222 (e.g., see FIG. 5, supra) is received by a detection circuit 260 at an inverting (−) input to a voltage comparator. The voltage comparator receives a reference voltage at a non-inverting (+) input thereof. The reference voltage can be selected to be less than the program voltage 515 applied to bitline$_1$ 222 for programming of programmed circuit 610, and larger than the low voltage 630 resulting from programming of the memory cell to the low resistance state. Accordingly, in response to the bitline voltage dropping from program voltage 515 to low voltage 630, the voltage comparator changes its output signal from a high voltage to a low program detect signal 640. Low program detect signal 640 deactivates a pmos transistor operating as shut-off transistor 262. This electrically isolates power supply 275 from multiplexer 250 and bitline$_1$ 222, and when accomplished prior to a duration of a program cycle for programmed circuit 610, can reduce overall power consumption associated with the program cycle. In various embodiments, the voltage comparator can be deactivated (e.g., unpowered) to reset low program detect signal 640 allowing multiplexer 250 to again connect to voltage supply 275.

Figure 7:
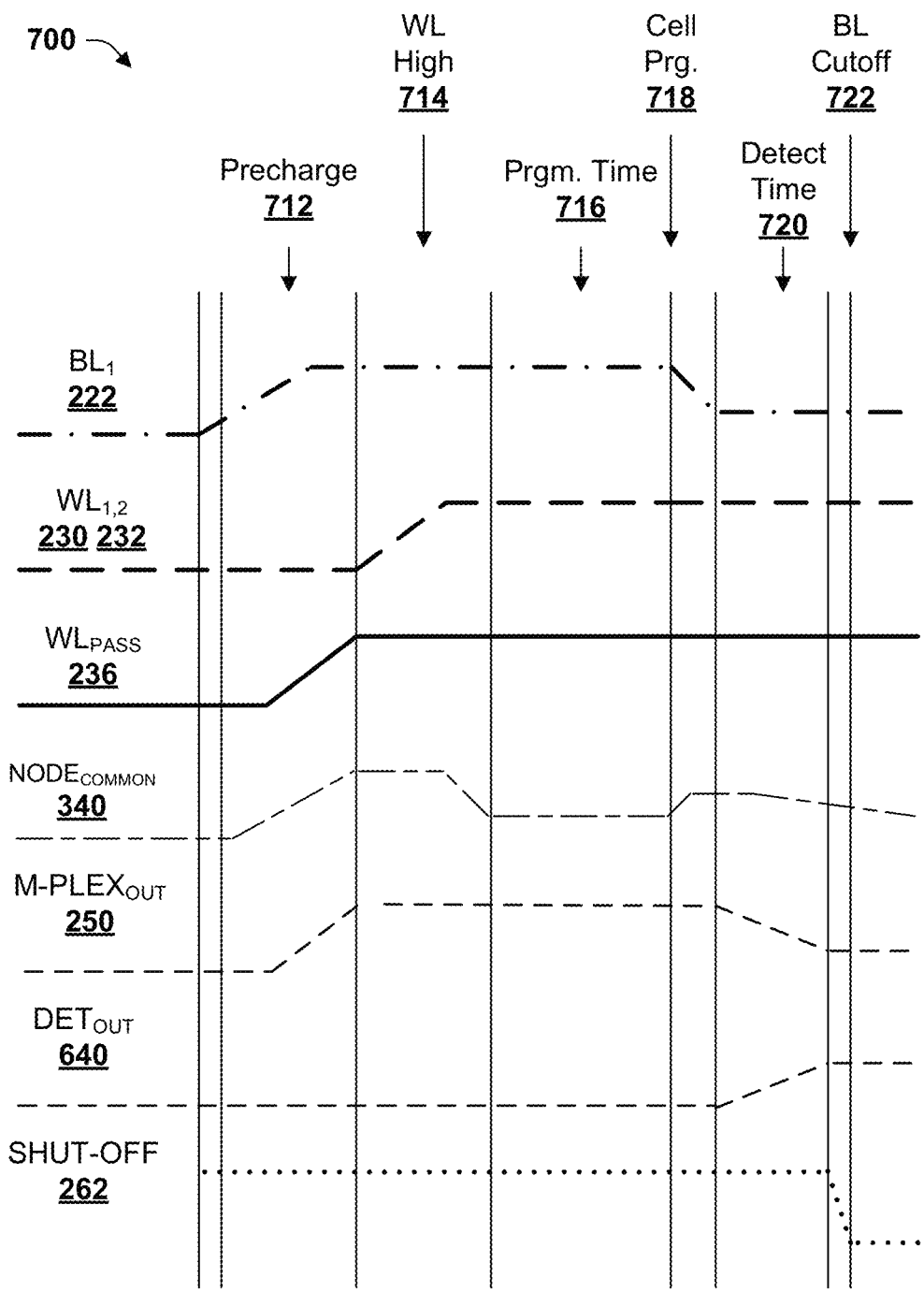
FIG. 7 illustrates an example timing diagram for the single-bitline PUF circuit with intrinsic program suppression and program disablement, in further embodiments.

FIG. 7 illustrates a timing diagram 700 for differential ReMEM program and detection circuit 600 in further disclosed embodiments. A vertical axis of timing diagram 700 displays signal levels at various nodes of differential ReMEM program and detection circuit 600, and a horizontal axis shows changes in signal levels over time. During a precharge phase 712, voltage on bitline$_1$ 222 is increased to a program voltage, and a pass wordline 236 is activated. This pulls up common node 340 as shown. During a wordline high phase 714, wordlines 230-232 are brought high, connecting common node 340 to low voltage or ground, and pulling voltage at common node 340 low. This initiates a program phase 716. At cell program phase 718 one of multiple resistive switching memory cells defining a differential identifier circuit becomes programmed to a low resistance state. Subsequently, charge on bitline$_1$ 222 begins to drop pulling common node 340 up. In addition, an output of multiplexer 250 at a detection circuit 260 begins to decrease, resulting in an increase at a detection output 640. A high signal produced at detection output 640 activates a shut-off transistor 262, separating bitline$_1$ 222 and multiplexer 250 from supply voltage. This shut-off can occur prior to completion of a program cycle for the differential identifier circuit, reducing power consumption associated with the differential PUF write operation.

The diagrams included herein are described with respect to several circuits, controllers, and arrays of resistive switching devices or an integrated circuit device(s) comprising multiple circuits, controllers, or arrays. It should be appreciated that such diagrams can include those circuits, controllers, etc., specified therein, some of the specified circuits/controllers/arrays, or additional circuits/controllers/arrays not explicitly depicted but known in the art or reasonably conveyed to those of skill in the art by way of the context provided herein. Components of disclosed integrated circuit devices can also be implemented as sub-components of another disclosed component (e.g., input 140 and output 150 can be sub-components of controller 120), whereas other components disclosed as sub-components can be separate components in various embodiments (e.g., PUF bits 112, OTP bits 114, MTP bits 116 or RNG bits 118 can be embodied in separate arrays as opposed to portions of array(s) 110). Further, embodiments within a particular Figure of the present specification can be applied in part or in whole to other embodiments depicted in other Figures without limitation, subject only to suitability to achieving a disclosed function or purpose as understood by one of skill in the art, and vice versa. As illustrative (and non-limiting) examples, array control circuitry 124 of FIG. 1 can be embodied by detection circuit 260 and shut-off transistor 262 of FIG. 6; array 210 of FIG. 2 can be incorporated within array(s) 110 of resistive switching memory cells of FIG. 1; array(s) 110 of resistive switching memory cells as depicted in FIG. 1 can be populated with differential PUF bit circuits 300 or array 210; array(s) 110 can be operably coupled with controller 120 as depicted or with controller 120 and some or all array control components of FIG. 11 (e.g., row control 1104, sense amps and write circuits 1108, column control 1106, clock source(s) 1110, address register 1114, reference and control signal(s) generator 1118, state machine 1120, input/output buffer 1112, command interface 1116), or substituted for memory array 1102 of FIG. 11, or volatile memory 1210A or non-volatile memory 1210B of FIG. 12, or suitable components of operating and control environment 1100 or environment 1200 can be substituted or added to other components or integrated circuit devices disclosed herein, and so forth. Additionally, it is noted that one or more disclosed processes can be combined into a single process providing aggregate functionality. For instance, a write process can comprise a read-verify process, or vice versa, to facilitate storing data at memory or generating data within memory and reading that stored/generated data, by way of a single process. Components of the disclosed architectures can also interact with one or more other components not specifically described herein but known by those of skill in the art.

Figure 8:
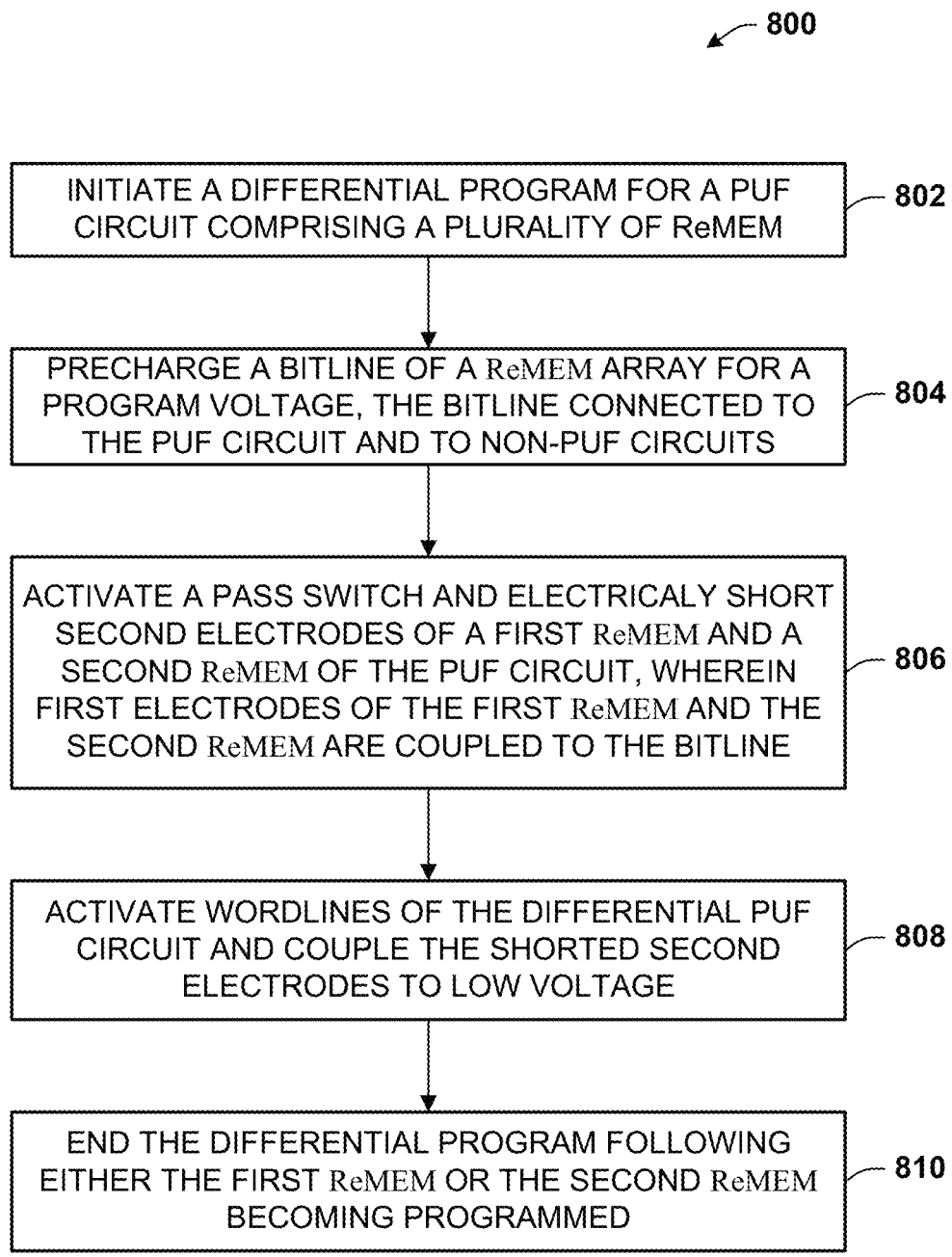
FIG. 8 illustrates a flowchart of an example method for providing differential program for a PUF bit defined by multiple ReMEM cells, in an embodiment(s).
Figure 9:
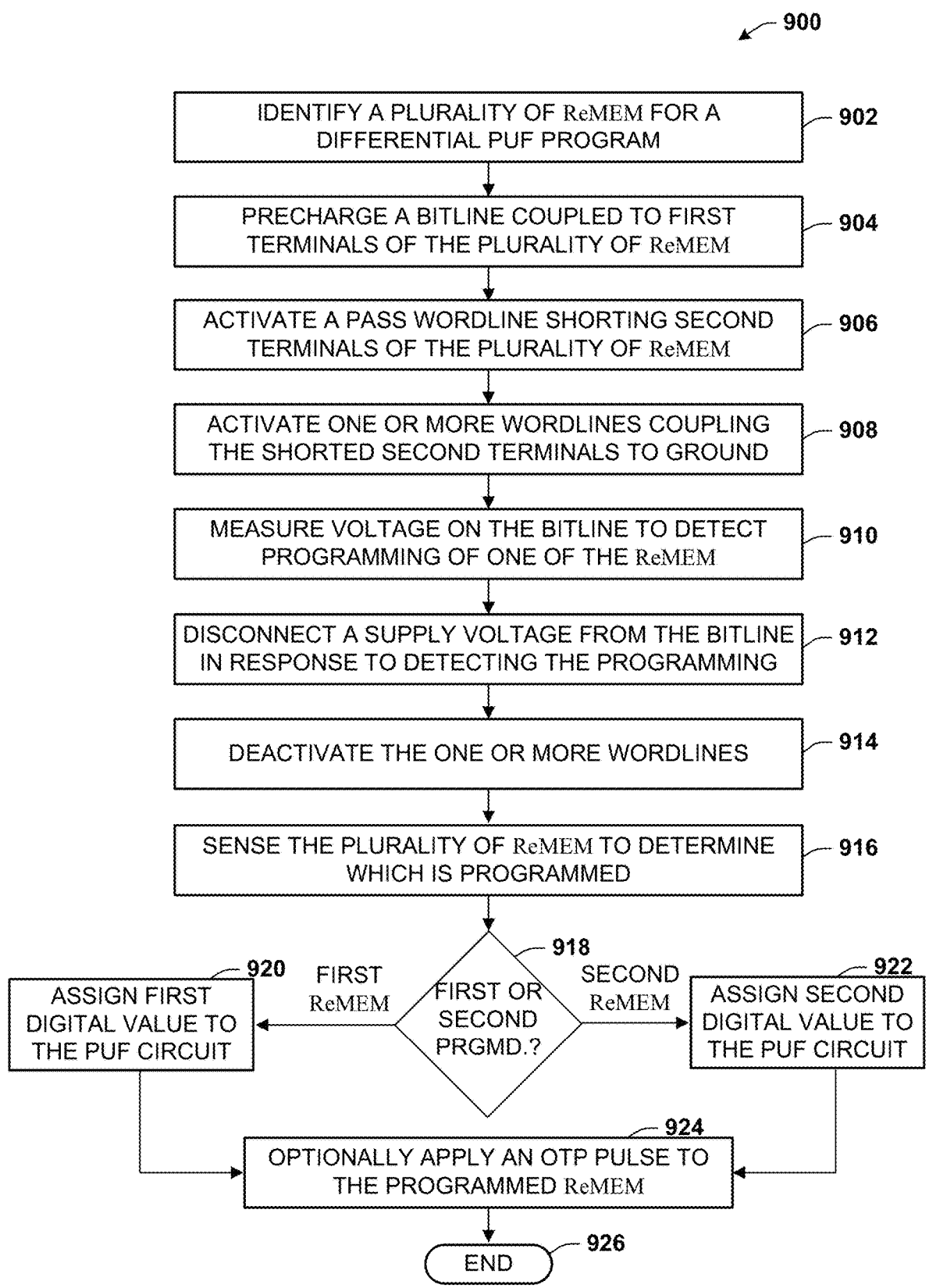
FIG. 9 depicts a flowchart of a sample method for differential programming with intrinsic suppression, program detection and program disablement, in an embodiment.
Figure 10:
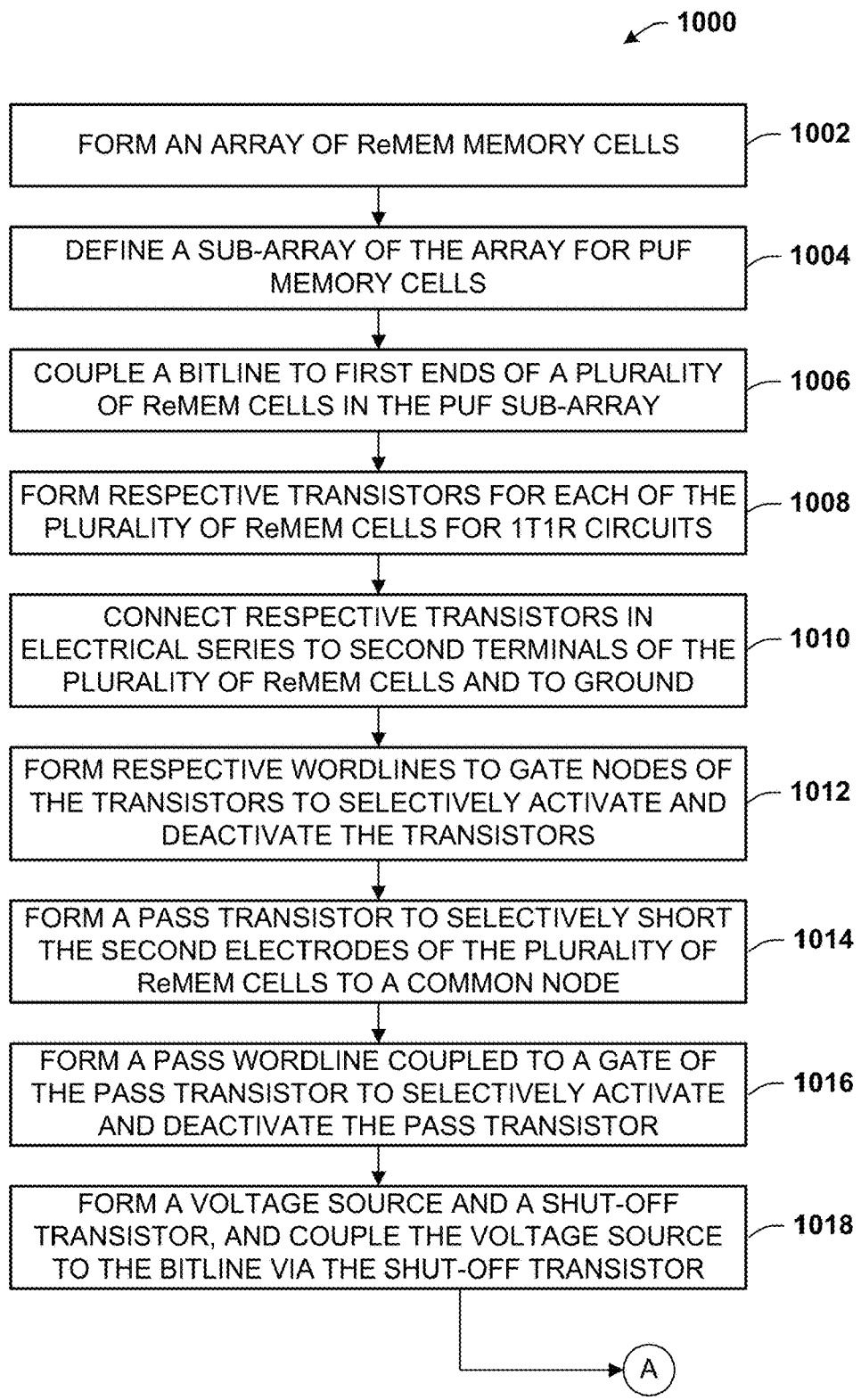
FIGS. 10 and 10A illustrate a flowchart of a sample method for fabricating a single-bitline PUF ReMEM circuit according to further disclosed embodiments.

In view of the exemplary diagrams described supra, process methods that can be implemented in accordance with the disclosed subject matter will be better appreciated with reference to the flow charts of FIGS. 8-10. While for purposes of simplicity of explanation, the methods of FIGS. 8-10 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein, and in some embodiments additional steps known in the art or reasonably conveyed to one of ordinary skill in the art by way of the context provided herein can be implemented as part of a disclosed method within the scope of the present disclosure. Moreover, some steps illustrated as part of one process can be implemented for another process where suitable; other steps of one or more processes can be added or substituted in other processes disclosed herein within the scope of the present disclosure. Additionally, it should be further appreciated that the methods disclosed throughout this specification are capable of being stored on an article of manufacture to facilitate transporting and transferring such methods to an electronic device, stored in embedded memory within the electronic device, and so forth. The term article of manufacture, as used, is intended to encompass a computer program accessible from any computer-readable device, device in conjunction with a carrier, or storage medium, or the like.

FIG. 8 depicts a flowchart of an example method 800 for operating a differential identifier circuit, according to one or more disclosed embodiments. Although the method is described with respect to a PUF operation, a RNG operation could be implemented in a similar manner. At 802, method 800 can comprise initiating a differential program operation for a physical unclonable feature (PUF) circuit comprising a plurality of ReMEM cells. In an embodiment(s), the plurality of ReMEM cells is part of an array of ReMEM cells. At 804, method 800 can comprise precharging a bitline of the array of ReMEM cells to a program voltage. The bitline can be connected to a first terminal of a first ReMEM cell of the plurality of ReMEM cells and can be connected to a first terminal of a second ReMEM cell of the plurality of ReMEM cells. Accordingly, precharging (or applying) the bitline can provide the program voltage at the first terminals of the first and second ReMEM cells. In at least one embodiment, the bitline can be connected to non-PUF circuits (e.g., an MTP memory cell, an OTP memory cell, or the like) within a non-PUF sub-array of an array of resistive memory cells. In an alternative embodiment(s), method 800 can continuously apply the program voltage to the bitline in response to initiating the differential program (as an alternative to precharging). In such embodiment(s), the program voltage can be applied for a duration of a program cycle, or until a program supply termination is accomplished.

At 806, method 800 can comprise activating a pass switch and electrically shorting second terminals of the first ReMEM cell and of the second ReMEM cell. In various embodiments, the pass switch can be embodied by a pass transistor having a first channel node coupled to a second terminal of the first ReMEM cell, a second channel node connected to a second terminal of the second ReMEM cell, and a gate node coupled to a pass wordline. Moreover, activating the pass switch can comprise providing a high signal on the pass wordline coupled to the gate node of the pass transistor.

At 808, method 800 can comprise activating one or more wordlines of the array of ReMEM cells and coupling the shorted second electrodes to low voltage (or ground, or a reverse polarity from the program voltage, etc.). At 810, method 800 can further comprise terminating the differential program in response to the first ReMEM cell or the second ReMEM cell becoming programmed.

According to one or more embodiments, method 800 can further comprise assigning a first digital value to the PUF circuit in response to the first ReMEM cell becoming programmed and assigning a second digital value to the PUF circuit in response to the second ReMEM cell becoming programmed. In yet an additional embodiment, method 800 can comprise suppressing the program voltage across the second ReMEM cell in response to the first ReMEM cell becoming programmed. In an aspect of the disclosed embodiments, suppressing the program voltage can be accomplished within less than 20 ns of programming of the first ReMEM cell. In at least some aspects, suppressing the program voltage can be accomplished within less than 10 ns (e.g., <10 ns, <9 ns, <8 ns, <7 ns, <6 ns, <5 ns, <4 ns, <3 ns, <2 ns, and so forth).

In still further embodiments, method 800 can comprise detecting the first ReMEM cell or the second ReMEM cell becoming programmed and disconnecting the program voltage from the bitline. In an alternative or additional aspect of the disclosed embodiments, method 800 can further comprise reading the first ReMEM cell and the second ReMEM cell in response to ending the differential program. Additionally, method 800 can comprise determining whether the first ReMEM cell or the second ReMEM cell has become programmed and applying a one-time programmable program pulse to the cell determined to have become programmed. In yet another embodiment, method 800 can further comprise selecting the PUF circuit for differential program in response to a host PUF write command received from a host device external to an integrated circuit device embodying the PUF circuit and the plurality of ReMEM cells (e.g., the PUF write command can be received from a command interface 1116 or input/output buffer 1112 as described in FIG. 11, infra, or from a command/data interface 130 as described in FIG. 1, supra, or can be received from an input port(s) 1240 or a network 1222 and communication interface(s) 1220 as described in FIG. 12, infra.

FIG. 9 depicts a flowchart of an example method 900 according to still further embodiments of the present disclosure. At 902, method 900 can comprise identifying a plurality of two-terminal ReMEM cells for a differential PUF program operation. At 904, method 900 can comprise precharging (or continuously applying) a bitline coupled to respective first terminals of the plurality of two-terminal ReMEM cells of an array of two-terminal ReMEM cells. At 906, method 900 can further comprise activating a pass wordline and shorting second terminals of the plurality of two-terminal ReMEM cells. Additionally, at 908, method 900 can comprise activating one or more wordlines coupling the shorted second electrode terminals to ground, and at 910, method 900 can comprise measuring voltage on the bitline to detect programming of one of the plurality of two-terminal ReMEM cells.

At 912, method 900 can comprise disconnecting a supply voltage from the bitline in response to detecting the programming of the one of the plurality of two-terminal ReMEM cells. Further, at 914, method 900 can comprise deactivating the one or more wordlines in response to detecting the programming. At 916, method 900 can comprise sensing the plurality of two-terminal ReMEM cells to determine which is programmed. At 918, a determination is made as to whether a first two-terminal ReMEM cell is programmed or a second two-terminal ReMEM cell is programmed. In response to the first cell being programmed, method 900 proceeds to 920 and assigns a first digital value to the PUF circuit. In the alternative, in response to the second cell being programmed, method 900 instead proceeds to 922 and assigns a second digital value, different from the first digital value, to the PUF circuit. From either 920 or 922, method 900 can proceed to 924 and optionally apply an OTP pulse to the programmed two-terminal ReMEM cell. At 926, method 900 can end.

Figure 10A:
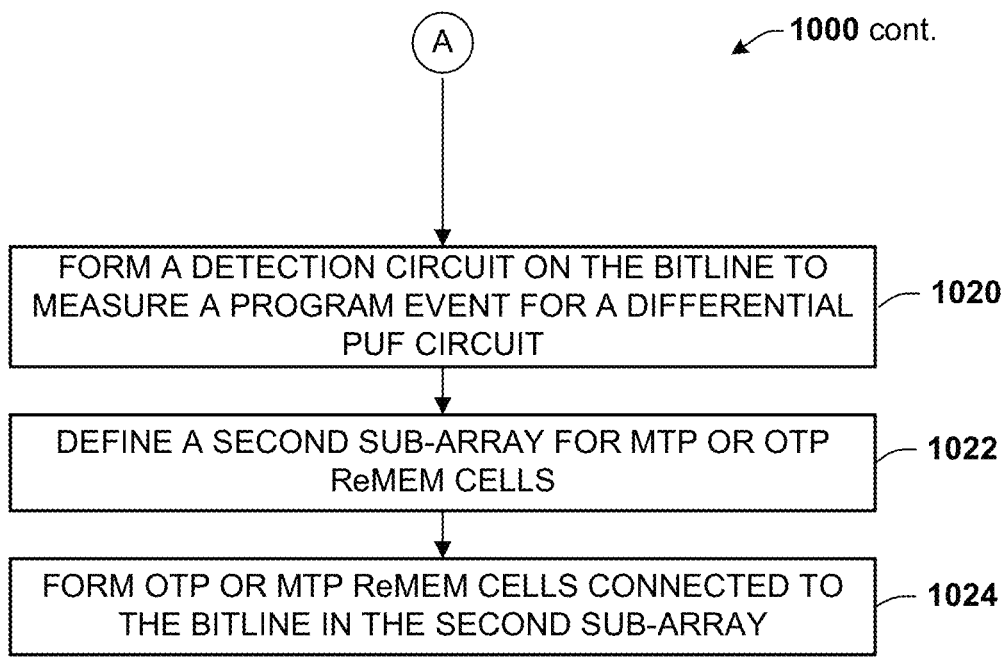

Referring to FIGS. 10 and 10A, beginning at FIG. 10 there is shown a flowchart of an example method 1000 for fabricating a memory device according to alternative or additional embodiments of the present disclosure. At 1002, method 1000 can comprise forming an array of resistive memory cells. At 1004, method 1000 can comprise defining a sub-array of the array of resistive memory cells for PUF memory cells, and at 1006, method 1000 can comprise coupling a bitline of the array to first terminals of a plurality of resistive memory cells in the PUF sub-array. At 1008, method 1000 can comprise forming respective transistors for each of the plurality of resistive memory cells and, at 1010, connecting the transistors in electrical series between respective second terminals of the plurality of resistive memory cells and to ground. For instance, a transistor can be connected at a first channel node of the transistor to a second terminal of one of the plurality of resistive memory cells and can be connected at a second channel node of the transistor to ground.

At 1012, method 1000 can comprise forming a set of wordlines and connect respective ones of the wordlines to gate nodes of the respective transistors. At 1014, method 1000 can comprise forming a pass transistor having a first channel node connected to a second terminal of a first of the plurality of resistive memory cells and having a second channel node connected to a second terminal of a second of the plurality of resistive memory cells. At 1016, method 1000 can comprise forming a pass wordline coupled to a gate node of the pass transistor to electrically connect or disconnect the second terminals of the first of the plurality of resistive memory cells and the second of the plurality of resistive memory cells. Further, at 1018, method 1000 can comprise forming a voltage source, and a shut-off transistor and coupling the voltage source to the bitline of the array through the shut-off transistor.

Referring now to FIG. 10A, method 1000 continues at 1020, and can comprise forming a detection circuit and couple the detection circuit to the bitline. The detection circuit can be configured to measure a program event for one of the plurality of resistive memory cells on the bitline and activate the shut-off transistor to thereby isolate the voltage source from the bitline in response to measuring the program event. In further embodiments, at 1022, method 1000 can comprise defining a second sub-array of the array for many-time programmable (MTP) or one-time programmable (OTP) memory cells, and at 1024, method 1000 can comprise forming OTP or MTP memory cells connected to the bitline within the second sub-array of the array.

Example Operating Environments

FIG. 11 illustrates a block diagram of an example operating and control environment 1100 for a memory array 1102 of a memory device according to aspects of the subject disclosure. Control environment 1100 and memory array 1102 can be formed within a single semiconductor die in some embodiments, although the subject disclosure is not so limited and in other embodiments some components of control environment 1100 can be formed on a separate semiconductor die. In at least one aspect of the subject disclosure, memory array 1102 can comprise memory selected from a variety of memory cell technologies. In at least one embodiment, memory array 1102 can comprise a two-terminal memory technology, arranged in a compact two or three-dimensional architecture. Suitable two-terminal memory technologies can include resistive-switching memory, conductive-bridging memory, phase-change memory, organic memory, magneto-resistive memory, or the like, or a suitable combination of the foregoing. In a further embodiment, the two-terminal memory technology can be a two-terminal resistive switching technology.

A column controller 1106 including, sense amps and write circuits 1108 can be formed adjacent to memory array 1102. Moreover, column controller 1106 can be configured to activate (or identify for activation) a subset of bit lines of memory array 1102. Column controller 1106 can utilize a control signal(s) provided by a reference and control signal generator(s) 1118 to activate, as well as operate upon, respective ones of the subset of bitlines, applying suitable program, erase or read voltages to those bitlines. Non-activated bitlines can be kept at an inhibit voltage (also applied by reference and control signal generator(s) 1118), to mitigate or avoid bit-disturb effects on these non-activated bitlines.

In addition, operating and control environment 1100 can comprise a row controller 1104. Row controller 1104 can be formed adjacent to and electrically connected with word lines of memory array 1102. Also utilizing control signals of reference and control signal generator(s) 1118, row controller 1104 can select one or more rows of memory cells with a suitable selection voltage. Moreover, row controller 1104 can facilitate program, erase or read operations by applying suitable voltages at selected word lines.

Sense amps and write circuits 1108 can read data from and write data to (respectively), the activated memory cells of memory array 1102, which are selected by column control 1106 and row control 1104. Data read out from memory array 1102 can be provided to an input/output buffer 1112. Likewise, data to be written to memory array 1102 can be received from the input/output buffer 1112 and written to the activated memory cells of memory array 1102.

A clock source(s) 1110 can provide respective clock pulses to facilitate timing for read, write, and program operations of row controller 1104 and column controller 1106. Clock source(s) 1110 can further facilitate selection of word lines or bit lines in response to external or internal commands received by operating and control environment 1100. Input/output buffer 1112 can comprise a command and address input, as well as a bidirectional data input and output. Instructions are provided over the command and address input, and the data to be written to memory array 1102 as well as data read from memory array 1102 is conveyed on the bidirectional data input and output, facilitating connection to an external host apparatus, such as a computer or other processing device (not depicted, but see e.g., computer 1202 of FIG. 12, infra).

Input/output buffer 1112 can be configured to receive write data, receive an erase instruction, receive a status or maintenance instruction, output readout data, output status information, and receive address data and command data, as well as address data for respective instructions. Address data can be transferred to row controller 1104 and column controller 1106 by an address register 1114. In addition, input data is transmitted to memory array 1102 via signal input lines between column control 1106 and input/output buffer 1112, and output data is received from memory array 1102 via sense amps (1108) and provided on signal output lines to input/output buffer 1112. Input data can be received from the host apparatus, and output data can be delivered to the host apparatus via the I/O bus.

Commands received from the host apparatus can be provided to a command interface 1116. Command interface 1116 can be configured to receive external control signals from the host apparatus and determine whether data input to the input/output buffer 1112 is write data, a command, or an address. Input commands can be transferred to a state machine 1120.

State machine 1120 can be configured to manage programming and reprogramming of memory array 1102 (as well as other memory banks of a multi-bank memory array). Instructions provided to state machine 1120 are implemented according to control logic configurations, enabling state machine 1120 to manage read, write, erase, data input, data output, and other functionality associated with memory cell array 1102. In some aspects, state machine 1120 can send and receive acknowledgments and negative acknowledgments regarding successful receipt or execution of various commands. In further embodiments, state machine 1120 can decode and implement status-related commands, decode and implement configuration commands, and so on.

To implement read, write, erase, input, output, etc., functionality, state machine 1120 can control clock source(s) 1110 or reference and control signal generator(s) 1118. Control of clock source(s) 1110 can cause output pulses configured to facilitate row controller 1104 and column controller 1106 implementing the particular functionality. Output pulses can be transferred to selected bit lines by column controller 1106, for instance, or word lines by row controller 1104, for instance.

Figure 12:
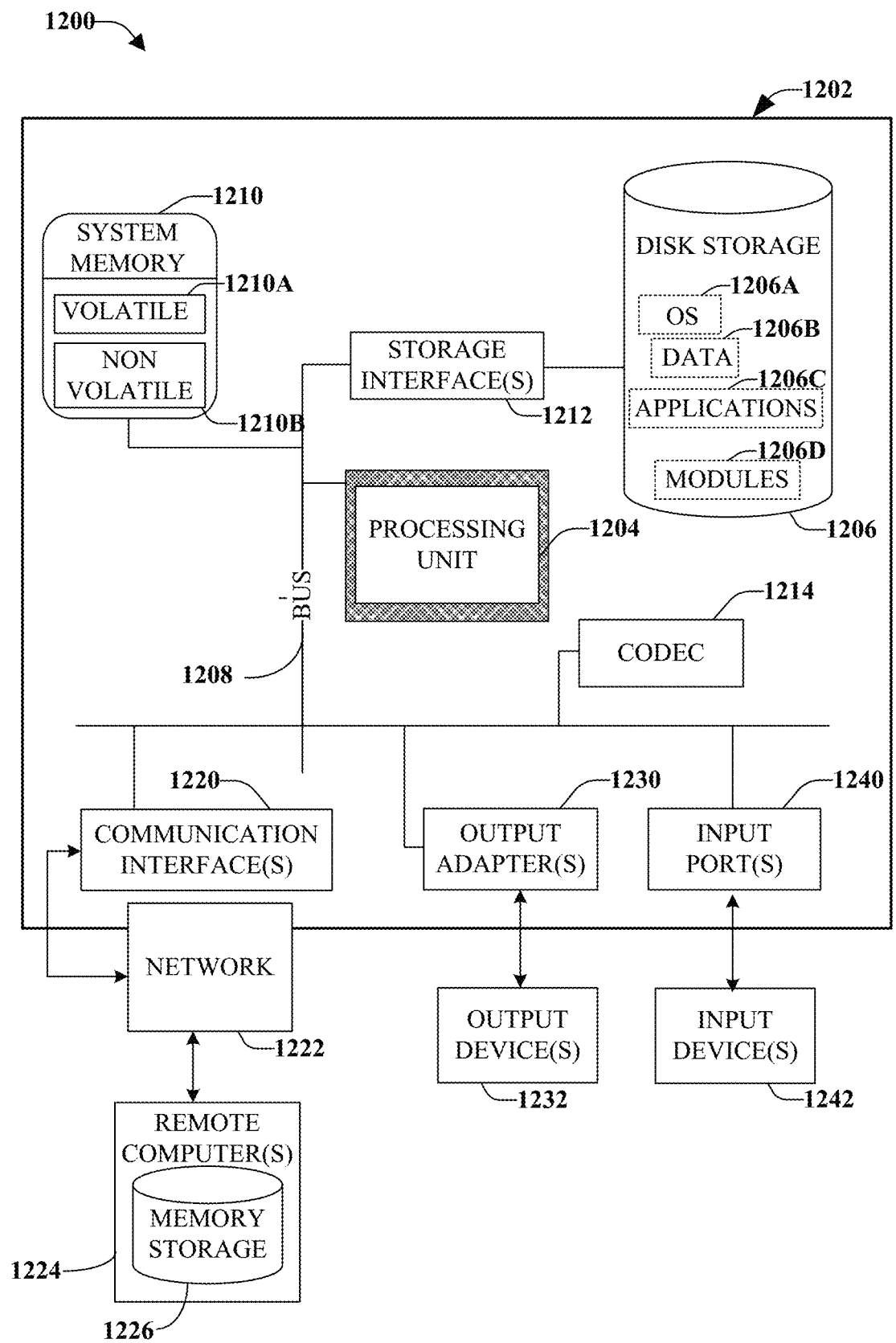
FIG. 12 illustrates a block diagram of an example computing environment for implementing one or more embodiments of the present disclosure.

In connection with FIG. 12, the systems, devices, and/or processes described herein can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

With reference to FIG. 12, a suitable environment 1200 for implementing various aspects of the claimed subject matter includes a computer 1202. The computer 1202 includes a processing unit 1204, a system memory 1210, a codec 1214, and a system bus 1208. The system bus 1208 couples system components including, but not limited to, the system memory 1210 to the processing unit 1204. The processing unit 1204 can be any of various available processors. Dual microprocessors and other multiprocessor architectures also can be employed as the processing unit 1204.

The system bus 1208 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1210 includes volatile memory 1210A and non-volatile memory 1210B. The basic input/output system (BIOS), containing the basic routines to transfer information between elements within the computer 1202, such as during start-up, is stored in non-volatile memory 1210B. In addition, according to present innovations, codec 1214 may include at least one of an encoder or decoder, wherein the at least one of an encoder or decoder may consist of hardware, software, or a combination of hardware and software. Although, codec 1214 is depicted as a separate component, codec 1214 may be contained within non-volatile memory 1210B. By way of illustration, and not limitation, non-volatile memory 1210B can include read only memory (ROM), programmable ROM (PROM), electrically programmable ROM (EPROM), electrically erasable programmable ROM (EEPROM), or flash memory, two-terminal memory, and so on. Volatile memory 1210A includes random access memory (RAM), and in some embodiments can embody a cache memory. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ES-DRAM).

Computer 1202 may also include removable/non-removable, volatile/non-volatile computer storage medium. FIG. 12 illustrates, for example, disk storage 1206. Disk storage 1206 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1206 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1206 to the system bus 1208, a removable or non-removable interface is typically used, such as storage interface 1212. It is appreciated that storage devices 1206 can store information related to a user. Such information might be stored at or provided to a server or to an application running on a user device. In one embodiment, the user can be notified (e.g., by way of output device(s) 1232) of the types of information that are stored to disk storage 1206 or transmitted to the server or application. The user can be provided the opportunity to opt-in Or opt-out of having such information collected and/or shared with the server or application (e.g., by way of input from input device(s) 1242).

It is to be appreciated that FIG. 12 describes software that acts as an intermediary between users and the basic computer resources described in the suitable operating environment 1200. Such software includes an operating system 1206A. Operating system 1206A, which can be stored on disk storage 1206, acts to control and allocate resources of the computer system 1202. Applications 1206C take advantage of the management of resources by operating system 1206A through program modules 1206D, and program data 1206D, such as the boot/shutdown transaction table and the like, stored either in system memory 1210 or on disk storage 1206. It is to be appreciated that the claimed subject matter can be implemented with various operating systems or combinations of operating systems.

A user enters commands or information into the computer 1202 through input device(s) 1242. Input devices 1242 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1204 through the system bus 1208 via input port(s) 1240. Input port(s) 1240 include, for example, a serial port, a parallel port, a game port, and a universal serial bus (USB). Output device(s) 1232 use some of the same type of ports as input device(s) 1242. Thus, for example, a USB port may be used to provide input to computer 1202 and to output information from computer 1202 to an output device 1232. Output adapter 1230 is provided to illustrate that there are some output devices 1232 like monitors, speakers, and printers, among other output devices 1232, which require special adapters. The output adapters 1230 include, by way of illustration and not limitation, video and sound cards that provide a means of connection between the output device 1232 and the system bus 1208. It should be noted that other devices and/or systems of devices provide both input and output capabilities such as remote computer(s) 1238.

Computer 1202 can operate in a networked environment using logical connections to one or more remote computers, such as remote computer(s) 1224. The remote computer(s) 1224 can be a personal computer, a server, a router, a network PC, a workstation, a microprocessor based appliance, a peer device, a smart phone, a tablet, or other network node, and typically includes many of the elements described relative to computer 1202. For purposes of brevity, only a memory storage device 1226 is illustrated with remote computer(s) 1224. Remote computer(s) 1224 is logically connected to computer 1202 through a network 1222 and then connected via communication interface(s) 1220. Network 1222 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication interface(s) 1220 refers to the hardware/software employed to connect the network 1222 to the bus 1208. While communication interface(s) 1220 is shown for illustrative clarity inside computer 1202, it can also be external to computer 1202. The hardware/software necessary for connection to the network 1222 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising".

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Further embodiments can be envisioned to one of ordinary skill in the art after reading this disclosure. For example, in various embodiments, erase operations may be initiated upon a plurality of ReMEM devices (e.g., 16, 32, etc.) at the same time.

In other embodiments, combinations or sub-combinations of the above disclosed embodiments can be advantageously made. The block diagrams of the architecture and flow charts are grouped for ease of understanding. However, it should be understood that combinations of blocks, additions of new blocks, re-arrangement of blocks, and the like are contemplated in alternative embodiments of the present disclosure.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated circuit device, comprising:
an array of two-terminal resistive switching memory (ReMEM) cells, the array further comprising:
a bitline;
a first one-transistor, one-resistor (1T1R) ReMEM circuit comprising a first transistor and a first two-terminal ReMEM cell, the first-two-terminal ReMEM cell having a first terminal coupled to the bitline and a second terminal coupled to a channel node of the first transistor, wherein a second channel node of the first transistor is coupled to ground;
a second 1T1R ReMEM circuit comprising a second transistor and a second two-terminal ReMEM cell, the second-two-terminal ReMEM cell having a first terminal coupled to the bitline and a second terminal coupled to a channel node of the second transistor, wherein a second channel node of the second transistor is coupled to ground;
a switching circuit electrically coupled to the second terminal of the second ReMEM cell and to the second terminal of the first ReMEM cell;
a pass wordline for selectively activating or deactivating the switching circuit to electrically short or electrically isolate, respectively, the second terminal of the first ReMEM cell and the second terminal of the second ReMEM cell;
a first wordline coupled to a gate node of the first transistor for connecting or disconnecting the second terminal of the first ReMEM cell to ground; and
a second wordline coupled to a gate node of the second transistor for connecting or disconnecting the second terminal of the second ReMEM cell to ground.

2. The integrated circuit device of claim 1, further comprising:
a voltage source selectively coupled to the bitline at least in part through a shut-off transistor; and
a detection circuit configured to detect a change in voltage on the bitline in comparison to a reference voltage.

3. The integrated circuit device of claim 2, further comprising an array controller configured to:
define the first 1T1R ReMEM circuit and the second 1T1R ReMEM circuit as a single identifier bit; and
implement a differential program for the single identifier bit;
wherein the detection circuit is configured to:
determine a program event for either the first 1T1R ReMEM circuit or for the second 1T1R ReMEM circuit; and
activate the shut-off transistor and disconnect the voltage source from the bitline in response to determining the program event.

4. The integrated circuit device of claim 3, wherein in response to the program event for the first 1T1R ReMEM circuit the electrical short of the second terminal of the first ReMEM cell and the second terminal of the second ReMEM cell at the switching circuit reduces voltage across the second ReMEM cell to a sub-program voltage, inhibiting programming of the second ReMEM cell.

5. The integrated circuit device of claim 3, wherein in response to the program event for the second 1T1R ReMEM circuit the electrical short of the second terminal of the first ReMEM cell and the second terminal of the second ReMEM cell at the switching circuit reduces voltage across the first ReMEM cell to a sub-program voltage, inhibiting programming of the first ReMEM cell.

6. The integrated circuit device of claim 1, wherein the pass wordline is positioned within the array immediately adjacent to the first wordline or to the second wordline.

7. The integrated circuit device of claim 6, wherein the pass wordline is positioned immediately adjacent to both the first wordline and to the second wordline.

8. The integrated circuit device of claim 1, further comprising a third 1T1R ReMEM circuit comprising a third ReMEM cell and a third transistor, wherein:
 a first terminal of the third ReMEM cell is connected to the bitline;
 a second terminal of the third ReMEM cell is connected to a channel node of the third transistor;
 a second channel node of the third transistor is connected to ground; and
 a third wordline is coupled to a gate node of the third transistor to selectively connect or disconnect the second terminal of the third ReMEM cell to ground.

9. The integrated circuit device of claim 8, wherein the second terminal of the third ReMEM cell has no connection to another ReMEM cell of the array.

10. The integrated circuit device of claim 9, wherein the array comprises a first sub-array allocated to physical unclonable feature (PUF) ReMEM circuits and a second sub-array allocated to many-time programmable (MTP) or one-time programmable (OTP) ReMEM circuits, and further wherein:
 the first 1T1R ReMEM circuit and the second 1T1R ReMEM circuit are located within the first sub-array; and
 the third 1T1R ReMEM circuit is located within the second sub-array.

11. A method for differential programming of an identifier circuit comprising a plurality of resistive memory (ReMEM) cells, comprising:
 initiating a differential program for a physical unclonable feature (PUF) circuit comprising a plurality of ReMEM cells, wherein the plurality of ReMEM cells is part of an array of ReMEM cells;
 precharging a bitline of the array of ReMEM cells to a program voltage, wherein the bitline is connected to a first terminal of a first ReMEM cell of the plurality of ReMEM cells and is connected to a first terminal of a second ReMEM cell of the plurality of ReMEM cells;
 activating a pass switch and electrically shorting a second terminal of the first ReMEM cell to a second terminal of the second ReMEM cell;
 activating one or more wordlines of the array of ReMEM cells and coupling the shorted second terminals of the first and second ReMEM cells to low voltage; and
 terminating the differential program in response to the first ReMEM cell or the second ReMEM cell becoming programmed.

12. The method of claim 11, further comprising one of: assigning a first digital value to the PUF circuit in response to the first ReMEM cell becoming programmed, or assigning a second digital value to the PUF circuit in response to the second ReMEM cell becoming programmed.

13. The method of claim 11, further comprising suppressing the program voltage across the second ReMEM cell in response to the first ReMEM cell becoming programmed.

14. The method of claim 13, wherein suppressing the program voltage is completed within less than 20 nanoseconds (ns) of the programming of the first ReMEM cell.

15. The method of claim 11, further comprising detecting the first ReMEM cell or the second ReMEM cell becoming programmed and disconnecting the program voltage from the bitline.

16. The method of claim 11, further comprising:
 reading the first ReMEM cell and the second ReMEM cell;
 determining whether the first ReMEM cell or the second ReMEM cell has become programmed; and
 applying a one-time programmable program pulse to the cell determined to have become programmed.

17. The method of claim 11, further comprising selecting the PUF circuit in response to a host PUF write command received from a host device external to the array of ReMEM cells.

18. A method of fabricating a memory device, comprising:
 forming an array of resistive memory cells;
 defining a sub-array of the array for physical unclonable feature (PUF) memory cells;
 coupling a bitline of the array to a first terminal of a first resistive memory cell in the PUF sub-array and to a first terminal of a second resistive memory cell in the PUF sub-array;
 forming a first transistor and a second transistor;
 connecting the first transistor in electrical series between a second terminal of the first resistive memory cell and ground and connecting the second transistor in electrical series between a second terminal of the second resistive memory cell and ground;
 forming a set of wordlines and connecting a first wordline of the set of wordlines to a gate node of the first transistor and connecting a second wordline of the set of wordlines to a gate node of the second transistor;
 forming a pass transistor having a first channel node connected to the second terminal of the first resistive memory cell and having a second channel node connected to the second terminal of the second resistive memory cell;
 forming a pass wordline coupled to a gate node of the pass transistor to electrically connect or disconnect the second terminals of the first resistive memory cell and of the second resistive memory cell;
 forming a voltage source;
 forming a shut-off transistor; and
 coupling the voltage source to the bitline of the array through the shut-off transistor.

19. The method of claim 18, further comprising:
 forming a detection circuit coupled to the bitline to measure a program event for either the first resistive memory cell or the second resistive memory cell and to deactivate the shut-off transistor; and
 isolating the voltage source from the bitline in response to measuring the program event.

20. The method of claim 18, further comprising:
 defining a second sub-array of the array for many-time programmable (MTP) or one-time programmable (OTP) memory cells; and
 forming OTP or MTP memory cells connected to the bitline within the second sub-array of the array.

* * * * *